(12) United States Patent
Vithanage et al.

(10) Patent No.: US 7,620,877 B2
(45) Date of Patent: Nov. 17, 2009

(54) SIGNAL DECODING METHODS AND APPARATUS

(75) Inventors: Cheran Malsri Vithanage, Bristol (GB); Christophe Andrieu, Bristol (GB); Robert Jan Piechocki, Bristol (GB); Mong Suan Yee, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 11/261,540

(22) Filed: Oct. 31, 2005

(65) Prior Publication Data

US 2006/0156207 A1 Jul. 13, 2006

(30) Foreign Application Priority Data

Jan. 10, 2005 (GB) ................................. 0500351.2

(51) Int. Cl.
H03M 13/45 (2006.01)
(52) U.S. Cl. ....................................... 714/780; 714/792
(58) Field of Classification Search ................. 714/780, 714/792
See application file for complete search history.

(56) References Cited

U.S. PATENT DOCUMENTS

| | | | | |
|---|---|---|---|---|
| 6,597,743 | B1 * | 7/2003 | Khayrallah et al. | 375/265 |
| 6,901,548 | B2 * | 5/2005 | Hattori et al. | 714/755 |
| 6,947,506 | B2 * | 9/2005 | Mills | 375/346 |
| 7,010,051 | B2 * | 3/2006 | Murayama et al. | 375/262 |
| 7,190,743 | B2 * | 3/2007 | Learned | 375/340 |
| 7,236,536 | B2 * | 6/2007 | Hochwald et al. | 375/265 |
| 7,245,666 | B1 * | 7/2007 | Gardner et al. | 375/267 |
| 7,248,651 | B2 * | 7/2007 | Love et al. | 375/341 |
| 7,248,849 | B1 * | 7/2007 | Ariyavisitakul et al. | 455/307 |
| 7,308,047 | B2 * | 12/2007 | Sadowsky | 375/324 |
| 7,321,644 | B2 * | 1/2008 | Love et al. | 375/341 |
| 7,321,646 | B2 * | 1/2008 | Arslan et al. | 375/346 |

FOREIGN PATENT DOCUMENTS

WO WO 03/075468 9/2003

OTHER PUBLICATIONS

G. Colavolpe et al, "Reduced-State BCJR-Type Algorithms," IEEE Journal on Selected Areas in Communications, vol. 19, No. 5, May 2001, pp. 848-859.

(Continued)

Primary Examiner—Stephen M Baker
(74) Attorney, Agent, or Firm—Oblon, Spivak, McClelland, Maier & Neustadt, L.L.P.

(57) ABSTRACT

This invention generally relates to methods, apparatus and computer program code for decoding signals, and more particularly to trellis-based decoding using a variant of a BCJR procedure. The invention includes a trellis decoder for decoding symbols of a received signal, the symbol including a sequence defined by transitions between states of a trellis, the trellis decoder including: means for performing a forward recursion through the trellis to determine a first set of probabilities ($\alpha(X_t)$) each defining a probability of a said trellis state ($X_t$) responsive to one or more current or earlier received signal values ($y_{1:t}$); means for providing a second set of ($\beta(X_t)$) probabilities each defining a probability of one or more received signal values ($y_{t+1:T}$) given an earlier the trellis state ($X_t$); means to decode the received signal to determine probabilities ($p(b_t|y_{1:T})$) for symbols of a corresponding transmitted sequence of symbols from the first and second sets of probabilities; and where the decoder further includes: means to select states for determining the first set of probabilities responsive to one or more received signal values later than a the trellis state defining a probability in said first set.

37 Claims, 11 Drawing Sheets

OTHER PUBLICATIONS

V. Franz et al, "Concatenated Decoding with a Reduced-Search BCJR Algorithm," IEEE Journal on Selected Areas in Communications, vol. 16, No. 2, Feb. 1998, pp. 186-195.

C. Fragouli et al, "Reduced-trellis equalization using the M-BCJR algorithm," Wireless Communications and Mobile Computing, Oct.-Dec. 2001, pp. 397-406.

* cited by examiner

SIGNAL DECODING METHODS AND APPARATUS

This invention generally relates to methods, apparatus and computer program code for decoding signals, and more particularly to trellis-based decoding using a variant of a BCJR procedure.

Broadly speaking a trellis diagram comprises a sequence of sets of states indexed by time, the states representing states of a data encoder and transitions between the states representing encoded data. A trellis decoder generally (but not necessarily) provides information on the probability of data symbols (transitions) or of individual trellis states since such soft information can be used as a priori information for iteratively improving a decoding process. The BCJR procedure (named after the inventors) provides trellis decoding assuming Markov data (where the evolution of a state depends on the current state but not its history).

In most wireless applications a channel codec is employed to improve the performance of the receiver. Therefore, for most receivers, especially iterative receivers, a soft output detector/decoder/equaliser is required to provide the soft input to the channel decoder. For an encoder with memory, the BCJR algorithm (L. Bahl, J. Cocke, F. Jelinek and J. Raviv, "Optimal decoding of linear codes for minimizing symbol error rate," *IEEE Trans. Information Theory*, vol. 20, pp. 284-287, March 1974) is the optimal trellis-based decoder/detector. Here, the encoder with memory can be the channel encoder or the dispersive channel. Since the optimal BCJR algorithm suffers from a high computational cost for a large trellis, which occurs, for example, for broadband systems and MIMO systems, various reduced state BCJR algorithms have been proposed, such as the M-BCJR, T-BCJR and pre-filtered BCJR algorithms. However, these methods suffer from performance degradation due to loss of information when the trellis states are reduced. Also, the performance of these methods is dependent on the memory and energy distribution of the 'encoder'.

The BCJR is an efficient and optimal algorithm for maximum a posteriori state estimation under the assumption of a hidden Markov chain with a discrete state space. It solves a trellis representation of the system by a forward recursion through each trellis stage (successive trellis stages corresponding to successive time instants) followed by a backward recursion through the trellis stages. This is described in more detail later. However in many applications there is a large number of possible states at each trellis stage.

Since the algorithm has a substantial computational cost for a large trellis reduced complexity variations are used for practical implementations. One such scheme is the M-BCJR algorithm (V. Franz and J. B. Anderson, "Concatenated decoding with a reduced-search BCJR algorithm," *IEEE Journal on Selected Areas in Commun.*, vol. 16, pp. 186-195, February 1998), which computes the recursions in the BCJR algorithm for only M states (a subset of the full set of trellis states) at every trellis stage. The M states are selected based on a metric of the BCJR algorithm, more particularly at a time t selecting the M states with the largest forward recursion parameter $\alpha_t$. This M-BCJR algorithm is able to perform well when the memory of the system is low (i.e. the channel impulse response is short), but performs poorly when the memory increases; the authors conclude that this approach is "not successful". In an alternative approach described by Franz and Anderson in the same paper (T-BCJR) only states with the forward recursion parameter $\alpha_t$ greater than a threshold are selected, but the authors note that this approach has the disadvantage that the computation can vary widely, which can present difficulties in certain applications, particularly in a hardware implementation with a maximum cycle rate.

The inventors have recognised that the M-BCJR algorithm selects its active states based on the filtered distribution of states up to that time instance and therefore makes a premature choice of the states selection.

According to a first aspect of the present invention there is therefore provided a trellis decoder for decoding symbols of a received signal, said symbol comprising a sequence defined by transitions between states of a trellis, the trellis decoder comprising: means for performing a forward recursion through said trellis to determine a first set of probabilities ($\alpha(X_t)$) each defining a probability of a said trellis state ($X_t$) responsive to one or more current or earlier received signal values ($y_{1:t}$); means for providing a second set of ($\beta(X_t)$) probabilities each defining a probability of one or more received signal values ($y_{t+1:T}$) given an earlier said trellis state ($X_t$); means to decode said received signal to determine probabilities ($p(b_t|y_{1:T})$) for symbols of a corresponding transmitted sequence of symbols from said first and second sets of probabilities; and wherein said decoder further comprises: means to select states for determining said first set of probabilities responsive to one or more received signal values later than a said trellis state defining a probability in said first set.

In some preferred embodiments the means for providing the second set of probabilities ($\beta(X_t)$) comprises means for performing a backwards recursion through the trellis to determine the probabilities. However in other embodiments this backwards recursion may be omitted and instead, for example, fixed probabilities for $\beta(X_t)$ employed to implement, say, an improved type of soft output Viterbi. In this latter case the second set of probabilities ($\beta(X_t)$) may be provided by, say, a stored number, and all the probabilities $\beta(X_t)$ may be set to the same value. In both cases the selection of states is more particularly responsive to one or more current or earlier received signal values $y_{(1:t)}$ in addition to the one or more received signal values later than the relevant trellis state.

Embodiments of the trellis decoder provide a reduced state variation of the BCJR procedure with improved performance in which a set of active states is selected at each time instance (trellis stage) in the forward recursion using received signals in the immediate future of the relevant time instant (trellis stage). Preferably the procedure looks over a predetermined time interval (a fixed lag), which may be selected, for example, responsive to the channel memory. In some preferred embodiments a smoothed distribution of states and/or state transitions is assumed at each time instance, which facilitates the use of a computationally simple Gaussian approximation, as described in more detail later. In embodiments this procedure is robust with respect to the memory or energy distribution of the underlying system and provides a performance approaching that of the conventional, optimal procedure but with only a fraction of the complexity.

Thus, broadly speaking, at each discrete time the procedure estimates a fixed lag smoothed distribution of the states (and state transitions) with a lag greater than zero. Then an active state (and state transition) selection is performed using these fixed lag smoothed distributions. Thereafter the metrics of the BCJR algorithm are computed only for the selected, active states. The backward recursion of the algorithm is similar to conventional BCJR but, again, is only carried out over the selected active states. In this way embodiments of the invention use only a fraction of the total states, thus reducing the complexity of the trellis based decoding whilst retaining a near-optimal performance. This is achieved by the use of future information obtained through the fixed lag smoothed distribution of states and state transitions and in this way the information loss through premature state selection is reduced.

Thus preferably the means to select states employs a Gaussian approximation to determine a likelihood of a trellis state from the future received signal values (in effect, treating the transmitted symbols as Gaussian random variables to reduce complexity, although in reality, this is not necessary always true). The selection of states (at a trellis stage) may be made by selecting transitions from previous trellis states (at a previous trellis stage). A transition defines a transmitted symbol and a further selection of state transitions may be made using the probability of a particular transmitted symbol given the previous trellis state and received signal values from a current time forward over the fixed time lag interval. Preferably states are further selected (at a current trellis stage) responsive to a probability of a particular state given the one or more later received signal values, and more particularly given a sequence of received signal values from an initially processed value through a current value to a future value a fixed time lag interval ahead of the current value.

In particular in embodiments states are selected based upon $p(X_t|y_{1:t+L'})$, that is based on a probability distribution of the states given all the received values from a first time instance to time t+L'. Preferably a further selection of state transitions is made from a set of selected states of time (t−1) by selecting from $p(b_t|X_{t-1},y_{t:t+L'})$, that is a probability distribution of the state transitions from a particular selected state $X_{t-1}$ given all the future received values at times t to t+L'.

The selection of states may be made dependent upon one or more log probability metrics dependent upon the one or more received signal values later than a time instant defined by a current trellis stage since this can reduce computational complexity.

In some embodiments the trellis decoding is applied iteratively, using a string of transmitted symbol probabilities given the received signal string as a priori information for another iteration of the decoding, with the aim of producing more accurate probabilities. As the skilled person will be aware, generally the output of a trellis decoder comprises soft (probability) information rather than hard information, although in embodiments the decoder may be configured to provide a (most likely) estimated transmitted symbol sequence output.

As previously mentioned, states at a current time are preferably selected responsive to a probability of the state given one or more later signal values, or more particularly given a sequence of signal values from an initial time to a future time ahead of the current time by a fixed time lag interval. This probability may be determined from a probability of a sequence of received signal values from a current time to a future time a fixed time lag interval ahead of the current time, given a previous (t−1) state. In preferred embodiments this latter probability is assumed to have a normal distribution, which simplifies the computational procedure. The multivariate normal distribution may be described by a mean vector and a covariance matrix. Where there is a non-uniform prior distribution of the symbols (for example because the decoding procedure is being applied iteratively or, for example because information is available from some other source such as a channel decoder), the covariance matrix becomes time dependent. The determination of the relevant probability (or equivalently a probability metric) requires a matrix inversion and thus for applications of this type the decoder preferably also includes means for extrapolating a value for the inverted covariance matrix at a particular time interval from its value at a previous time, this again reducing computational complexity.

More particularly a probability distribution $p(y_{t:t+L'}|X_{t-1})$ (see Equations 2 and 9a below) may be approximated by a multivariate normal distribution with a covariance matrix $\Sigma_t$, with means for extrapolating a value of an inverse of said matrix from a value at one said trellis state to a value at a later said trellis state. The probability of the transmitted symbols given a particular selected state of earlier time instance and future received signals may evaluated by considering how the distribution factorises across the symbols transmitted, that is approximating $p(b_t|X_{t-1},y_{t:t+L'})$ by the product of $p(b_t^j|X_{t-1}, y_{t:t+L'})$ for the index j running through all the unknown transmitted symbols. Here j labels, for example, the jth component of a sequence of symbols (such as space-time symbols) transmitted together. The probability distribution $p(b_t^j|X_{t-1},y_{t:t+L'})$ may be approximated by a multivariate normal distribution with a covariance matrix $\Sigma_{t,j}$, with means for extrapolating a value of an inverse of the matrix from the value the inverse of the matrix $\Sigma_t$.

In some preferred embodiments of the invention a received signal value comprises a vector of signals received over a MIMO (Multiple Input Multiple Output) channel, or in general a vector of signals in a receiver having multiple observations pertaining to a single time instance. This vector may define, for example, a space-time symbol in a spatially multiplex MIMO communications system such as a system in which multiple transmit antennas/data streams are transmitted by a single user/transmitter. In other embodiments the decoder may be employed for multi-user detection, for example where multiple users each with a single transmit antenna transmit at the same time (in this case the symbols transmitted over the different channels, for example from users with different spreading sequences, are then uncorrelated).

In still other embodiments the decoder may be employed for decoding transmitted signals with other diversities such as CDMA, in which signals from multiple users, optionally employing multiple antennas, differentiated by their unique spreading sequence codes, are received at a receiver. This is because channel effects can reduce orthogonality of the received signals so that additional processing may be necessary to differentiate the signals from the different users. Embodiments of the decoder may also be employed in OFDM (Orthogonal Frequency Division Multiplexed) MIMO or other communication systems.

Embodiments of a trellis decoder as described above may be employed for trellis-based decoding of a space-time code and/or a channel code, and/or equalisation. In some preferred embodiments joint equalisation and decoding of a channel coded and/or space-time coded system is performed. In general embodiments of the above described decoder provide reduced complexity decoding for any "encoder" which can be represented by a trellis diagram. Particular applications of embodiments of the decoder include a turbo decoder for example of the type required by UMTS (Universal Mobile Telecommunications System) or some wireless LAN (Local area Network) standards, and equalises, for example of the type required by the EDGE (Enhanced Data for Global Evolution) standard.

In a related aspect the invention provides a method of decoding symbols of a received signal, said symbols comprising a sequence defined by transitions between states of a trellis, each said trellis state being associated with a time, the method comprising: performing a forward recursion through said trellis to determine a first set of probabilities each defining a probability of a said trellis state responsive to prior values of said received signal; obtaining a second set of probabilities each defining a probability of one or more received signal values given a prior said trellis state; and decoding said received signal to determine probabilities for symbols of a corresponding transmitted sequence of symbols from said first and second sets of probabilities; the method further comprising: selecting states for determining said first set of probabilities responsive to one or more received signal values later than a said trellis state defining a probability in said first set.

In some preferred embodiments obtaining the second set of probabilities comprises performing a backwards recursion through the trellis to determine the probabilities.

Thus broadly speaking in embodiments, as described above in the first set of probabilities each probability is associated with a trellis state and the states for processing are based upon received signal values from future times (each trellis state being associated with a respective time), that is times later than that of the relevant state.

In a further related aspect the invention provides a method of decoding a trellis coded signal using a BCJR-type procedure in which probabilities of transmitted symbols are determined by forwards and backwards iteration through a trellis having successive sets of states associated with successive received signal time intervals, a set of states defining a trellis stage, the method comprising reducing the number of states processed at a said trellis stage ($X_t$) by selecting states for evaluation for determining said probabilities based upon future received signal values ($y_{t:t+L}'$) at said stage.

Preferably, as previously described, the selecting of states comprises selecting transitions from a previously selected set of states in a previous trellis stage, preferably followed by further selection from among the states selected by selecting transitions. This further selection is preferably responsive to a probability of a state (in a current trellis stage) conditioned on the (one or more) future received signal values (and preferably also on a current received signal value). Preferably a normal distribution is assumed for the future received sequence. A determined probability in embodiments comprises a log probability; in some preferred embodiments the selecting of transitions and/or states comprises evaluating one or more log probability metrics.

The invention further provides a decoder configured to implement the above described methods, and in particular including means for implementing the features of the methods.

Thus the invention also provides a decoder for decoding a trellis coded signal using a BCJR type procedure in which probabilities of transmitted symbols are determined by forwards and backwards iteration through a trellis having successive sets of states associated with successive received signal time intervals, a set of states defining a trellis stage, the decoder including a system to reduce the number of states processed at a said trellis stage ($X_t$) by selecting states for evaluation for determining said probabilities based upon future received signal values ($y_{t:t+L}'$) at said stage, more particularly as well as the received values so far ($y_{1:t-1}$).

The invention further provides a trellis decoder for decoding a trellis coded signal using a BCJR type procedure in which probabilities of transmitted symbols are determined by forwards and backwards iteration through a trellis having successive sets of states associated with successive received signal time intervals, a set of states defining a trellis stage, the decoder comprising: a received signal input for said trellis coded signal; an output for providing decoded signal data; program memory for storing processor control code; and a processor coupled to said received signal input, to said output and to said program memory for loading and implementing said code, said code comprising code to: reduce the number of states processed at a said trellis stage ($X_t$) by selecting states for evaluation for determining said probabilities based upon future received signal values ($y_{t:t+L}'$) at said stage, more particularly as well as the received values so far ($y_{1:t-1}$)

The invention further provides a trellis decoder for decoding symbols of a received signal, said symbols comprising a sequence defined by transitions between states of a trellis each said trellis state being associated with a time, the decoder comprising: a received signal input for said trellis coded signal; an output for providing decoded signal data; program memory for storing processor control code; and a processor coupled to said received signal input, to said output and to said program memory for loading and implementing said code, said code comprising code to: perform a forward recursion through said trellis to determine a first set of probabilities each defining a probability of a said trellis state responsive to prior values of said received signal; obtain a second set of probabilities each defining a probability of one or more received signal values given a prior said trellis state; and decode said received signal to determine probabilities for symbols of a corresponding transmitted sequence of symbols from said first and second sets of probabilities; the code further comprising code to: select states for determining said first set of probabilities responsive to one or more received signal values later than a said trellis state defining a probability in said first set.

The code to obtain the second set of probabilities may comprise code to perform a backwards recursion through said trellis to determine the probabilities, or may simply comprise code to assign a value, for example a fixed value, to each of said probabilities in said second set.

The invention further provides a receiver incorporating a decoder as described above.

The invention further provides processor control code to implement the above-described decoders and methods; and a trellis data structure storing BCJR trellis data for trellis states comprising substantially only those states which are selected by a decoder/method according to an embodiment of the invention. This code (and data) may be provided on a data carrier (sometimes referred to as a computer program product) such as a disk, CD- or DVD-ROM, programmed memory such as read-only memory (Firmware), or on a data carrier such as optical or electrical signal carrier.

For many applications embodiments of the above-described decoders, and decoders configured to function according to the above-described methods, will be implemented on a DSP (Digital Signal Processor), ASIC (Application Specific Integrated Circuit) or FPGA (Field Programmable Gate Array). Thus code (and data) to implement embodiments of the invention may comprise code in a conventional programming language such as C or, for example, code such as microcode. However code to implement embodiments of the invention may alternatively comprise code for setting up or controlling an ASIC or FPGA, or code for a hardware description language such as Verilog (Trade Mark), VHDL (Very high speed integrated circuit Hardware Description Language) or SystemC. As the skilled person will appreciate such code and/or data may be distributed between a plurality of coupled components.

As the skilled person will recognise, embodiments of the above described decoders and methods may be implemented in software or in hardware, in a combination of the two.

These and other aspects of the present invention will now be further described, by way of example only, with reference to the accompanying figures in which.

Figure 8:
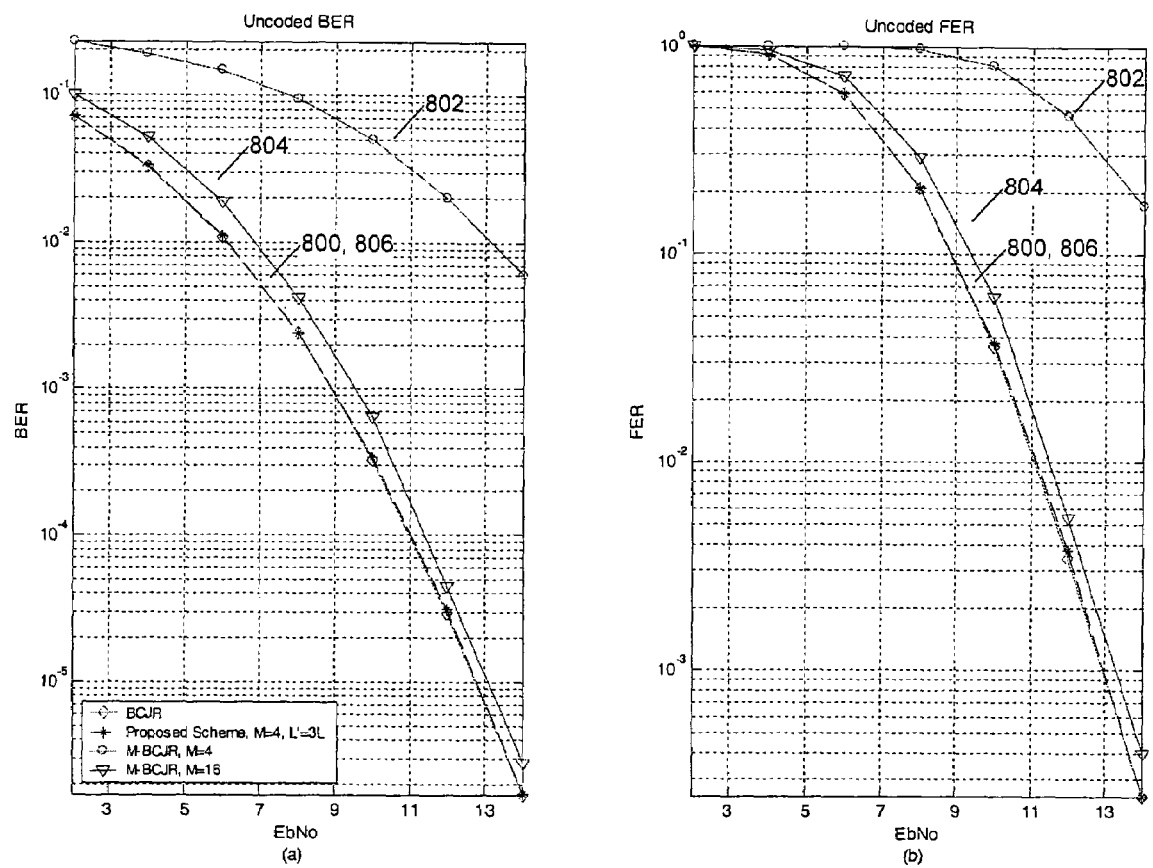
Figure 9:
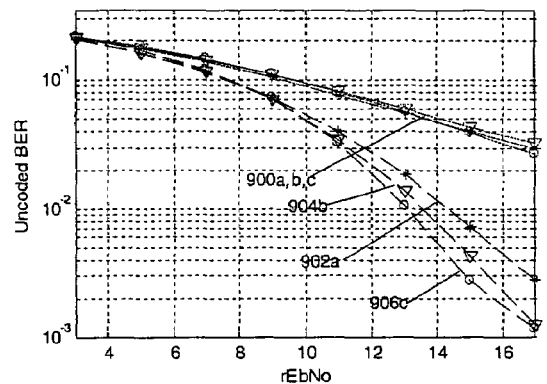
Figure 9:
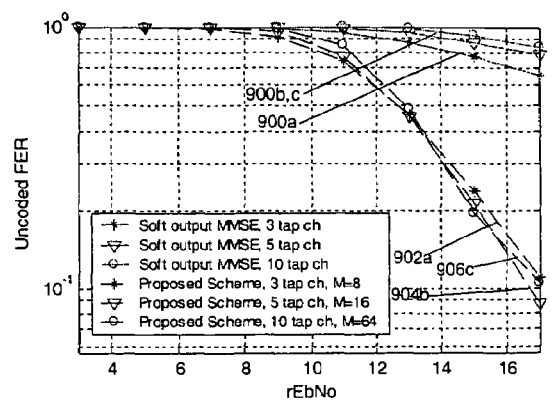
Figure 9:
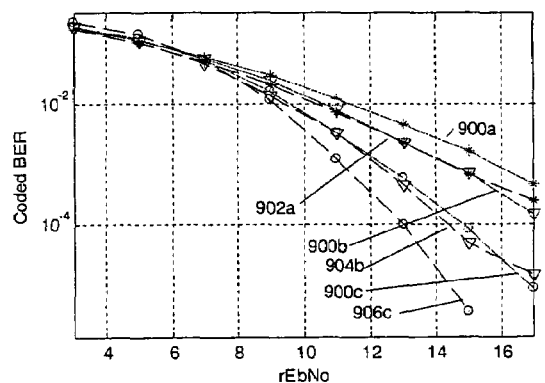
Figure 9:
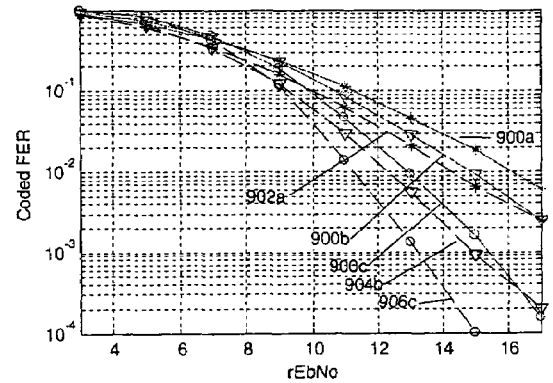

FIG. 8 shows graphs of bit error rate and frame error rate against signal-to-noise ratio for a first communication system comparing the performance of an embodiment of the invention with prior art techniques; and FIG. 9 shows graphs of bit error rate and frame error rate against signal-to-noise ratio for a second communications system comparing the performance of embodiments of the invention against prior art techniques.

We first describe the BCJR procedure; for additional background information reference may be made to Bahl, Cocke, Jelinek and Raviv, and to Franz and Anderson (ibid, hereby incorporated by reference).

Let us consider a state sequence, $X_{0:T}$ that forms a Markov chain and that produces an output sequence $y_{1:T}$, with a joint distribution that factorizes generally as $$p(X_{0:T}, y_{1:T}) = \left[\prod_{t=1}^{T} p(y_t | X_{t-1}, X_t) \cdot p(X_t | X_{t-1})\right] \cdot p(X_0),$$

with $p(X_0)$ being the initial state probability density. In other words at each time instant t we also have the conditional independence $p(y_t|X_{1:t})=p(y_t|X_{t-1},X_t)$. Situations with $y_t$ being independent of $X_{t-1}$ as well are thus a special case of this formulation. Here, the notation $A_{t:t+B}$ refers to the sequence of states or symbols from time t to t+B, i.e $A_{t:t+B}=\{A_t, A_{t+1}, \ldots, A_{t+B}\}$. Let each state $X_t$ come from the set $S_X$ with cardinality $|S_X|$. When the sequence $y_{1:T}$ is observed, a linear time algorithm for the evaluation of the a posteriori probabilities $p(X_t|y_{1:T})$ and $p(X_{t-1},X_t|y_{1:T})$ for all $X_{t-1},X_t \in S_X$ and $t\in\{1,\ldots,T\}$ is the BCJR algorithm [1]. This algorithm involves a forward recursion through the trellis formed by the possibilities of the state sequence $X_{0:T}$, in which the computation $\gamma(X_{t-1},X_t)=p(X_t,y_t|X_{t-1})$ and the recursive calculations of the metric $$\alpha(X_t) = p(X_t, y_{1:t}) = \sum_{X_{t-1}\in S_X} \alpha(X_{t-1})\gamma(X_{t-1}, X_t)$$

are made, and a backward recursion in which the recursive calculations of the metric $$\beta(X_t) = p(y_{t+1:T} | X_t) = \sum_{X_{t+1}\in S_X} \beta(X_{t+1})\gamma(X_t, X_{t+1})$$

are made. Thereafter the A Posteriori probabilities of the states and state transitions can be evaluated by $p(X_t|y_{t:T})\propto\alpha(X_t)\beta(X_t)$ and $p(X_{t-1},X_t|y_{1:T})\propto\alpha(X_{t-1})\gamma(X_{t-1},X_t)\beta(X_t)$ for all $X_{t-1},X_t\in S_X$ and $t\in\{1,\ldots,T\}$. Although the complexity of this algorithm is linear in time T, it is also linear on $|S_X|$ which can be millions in some practical problems such as the equalization of MIMO systems. Thus there are many practical applications in which the algorithm cannot be implemented cost effectively.

The inventors have recognised that a reduced state version of this procedure can still perform well, and this is now described.

The procedure selects M active states at each time instance in the forward recursion, but unlike the M-BCJR algorithm mentioned above, which selects the M active states which have the largest metric $\alpha(X_t)$, we use a fixed lag L' smoothed distribution of states $p(X_t|y_{1:t+L'})$ at a particular time instance t for selecting states at that time instance, with L'>0. Thereby we consider the future received (signal) values in making the active state selection for a particular time instance. The lag L' can be chosen to account for the memory of the system (for example responsive to the average duration of the channel impulse response) and can be a compromise between performance and complexity.

To reduce the complexity of estimating this fixed lag smoothed density we use a Gaussian approximation technique. This technique has previously been described in Shoumin Liu and Zhi Tian, "Near-optimum soft decision equalization for frequency selective MIMO channels," *IEEE Trans. Signal Processing*, vol. 52, pp. 721-733, March 2004, in particular at Section III-A of this paper, the contents of which are hereby incorporated by reference in their entirety.

We next present the implementation of these ideas for the equalization of a spatially multiplexed system. This will be described with specific reference to a MIMO system having a plurality m of transmit antennas and a plurality n of receive antennas, however the skilled person will recognise that the techniques described are general and can be applied to other decoding problems where the data for decoding can be represented by a trellis, no matter what the transmitted and received signals.

To facilitate understanding of the later discussion it is helpful to illustrate a typical example of a MIMO communications system.

Figure 1:
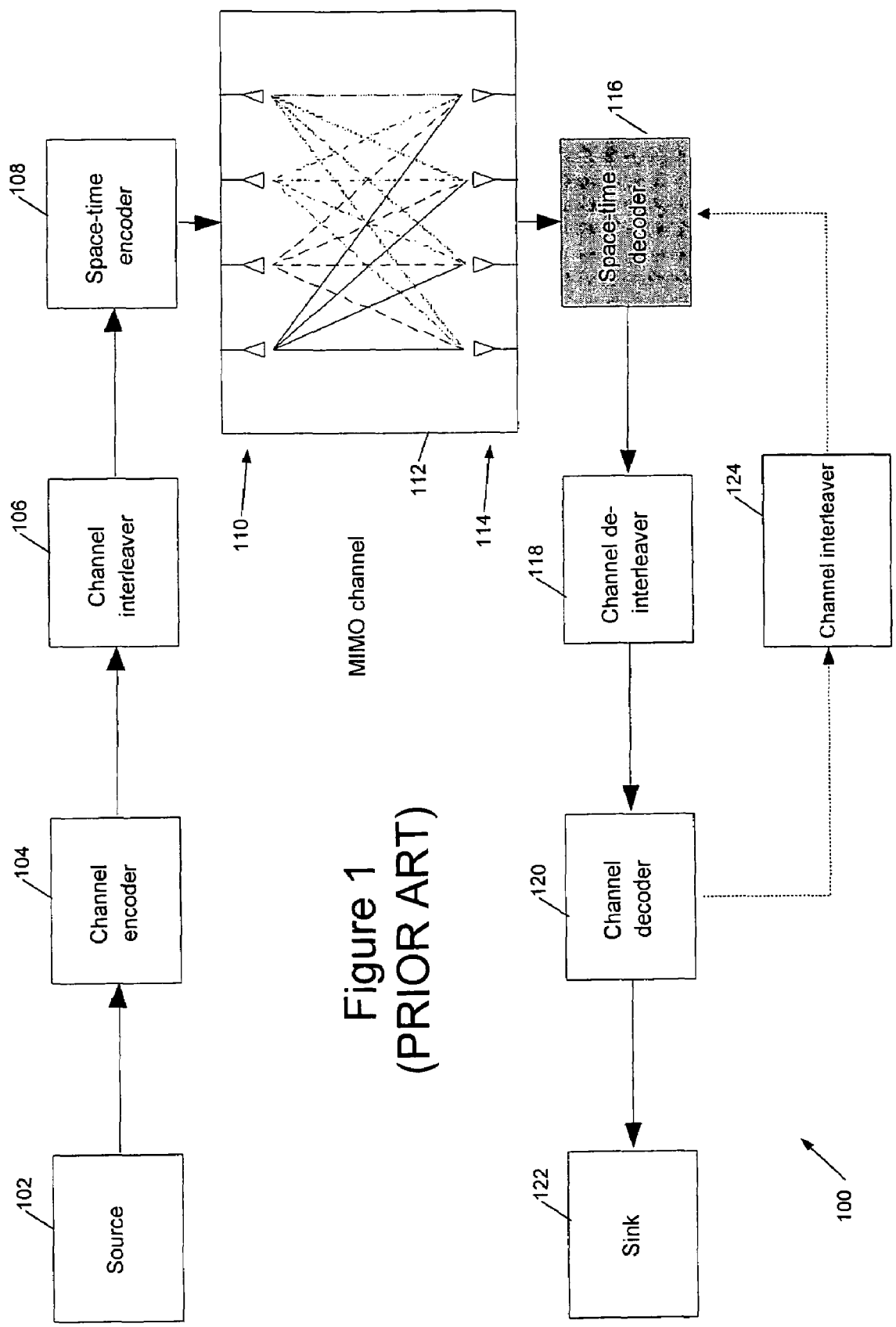
FIG. 1 shows an example of a MIMO communications system.

Thus FIG. 1 shows an example of a known MIMO data communications system 100 in which a data source 102 provides data to a channel encoder 104 typically comprising a convolutional coder such as a recursive systematic convolutional (RSC) encoder, or a stronger so-called turbo encoder (which includes an interleaver). The channel encoder 104 is in this example followed by a channel interleaver 106 and a space-time encoder 108. The space-time encoder 108 encodes an incoming symbol or symbols as a plurality of code symbols for simultaneous transmission from each of a plurality of transmit antennas 110 and may be described in terms of an encoding machine which operates on the data to provide spatial and temporal transmit diversity. This is generally followed by a modulator (not shown) to modulate the coded symbols for transmission. Space-frequency encoding may additionally (or alternatively) be employed.

The encoded transmitted signals propagate through MIMO channel 112 to receive antennas 114, which provide a plurality of inputs to a space-time (and/or frequency) decoder 116, which has the task of removing the effect of the encoder 108 and the MIMO channel 112. The output of the decoder 116 comprises a plurality of signal streams, one for each transmit antenna, each carrying so-called soft or likelihood data on the probability of a transmitted symbol having a particular value. This is (here) provided to a channel de-interleaver 118 which reverses the effect of channel interleaver 106, and then to a channel decoder 120, conventionally for example a Viterbi decoder, which decodes the convolutional code. The channel decoder 120 may be a SIHO (soft-in hard-out) decoder that is receiving symbol (or bit) likelihood data and providing data on which a hard decision has been made. The output of channel decoder 120 is provided to a data sink 122, for further processing of the data in any desired manner. In some systems turbo decoding may be employed, where a soft output from a SISO (soft-in soft-out) channel decoder 120 is provided to a channel interleaver 124 (corresponding to interleaver 106), which in turn provides soft (likelihood) data to decoder 116 for iterative space-time (and/or frequency) and channel decoding.

Embodiments of a decoder as described herein may be employed to implement one or both (optionally combined or jointly) of ST decoder 116 and channel 120, or may be employed for other decoding tasks.

We now describe in detail an embodiment of a procedure according to the present invention.

Let us consider an m transmit antenna n receive antenna spatial multiplexing system, where the channel memory of each transmit antenna to receive antenna path is L. Let the fading coefficient of the $d^{th}$ channel tap from $j^{th}$ transmit antenna to the $i^{th}$ receive antenna be denoted by $h^{i,j}(d)$ for $d \in [0,L]$, $j \in [1,m]$ and $i \in [1,n]$.

Let us also denote the signal received at the $i^{th}$ receive antenna at the $t^{th}$ time instance by $y_t^i$, and the antenna symbol transmitted by the $j^{th}$ transmit antenna at the $t^{th}$ time instance by $b_t^j$. Let us assume that the symbol $b_t^j$ is chosen from the set $B=\{a_1, a_2, \ldots, a_N\}$ with cardinality N. The received signal $y_t^i$ is determined by the convolution of the channel impulse response and a sequence of symbols transmitted up to L+1 time instants and an additive white Gaussian noise $w_t^i$:

$$y_t^i = \sum_{d=0}^{L} \left[ \sum_{j=1}^{m} h^{i,j}(d) b_{t-d}^j \right] + w_t^i \quad (1)$$

The equalizer's task in this scenario is to consider the received signal $y_t^i$ and detect the transmitted symbols $b_t^j$.

Here $b_t^j$ is a real or complex number, as is $y_t^i$, and h(d) is an (n×m) matrix with the i th row and j th column component given by $h^{i,j}(d)$.

For a MIMO channel an estimate of the matrix h can be obtained in a conventional manner, for example, using a training sequence transmitted from each transmit antenna in turn (to avoid interference problems), each time listening on all the receive antennas to characterise the channels from that transmit antenna to the receive antennas. This need not constitute a significant overhead since training may only be performed at intervals, say every 0.1 seconds for a slowly changing indoor channel, and data rates may be high in between training. Alternatively orthogonal sequences may be transmitted simultaneously from all the transmit antennas (although this increases the complexity of the training as interference problems can then arise).

Now, denoting vector transpose operation by $(\bullet)^\dagger$, a state of the decoder (equalizer) at time t can be defined as $X_t = (b_t^1, \ldots, b_t^m, \ldots, b_{t-L+1}^1, \ldots, b_{t-L+1}^m)^\dagger$ and the received vector at time t can be taken as $y_t = (y_t^1, \ldots, y_t^n)^\dagger$. The symbols transmitted by all antennas at time t are collectively termed (in this example) a "space-time" symbol given by vector $b_t = (b_t^1, b_t^2, \ldots, b_t^m)^\dagger$; in other embodiments the vector $b_t$ can define multiuser, CDMA, OFDM or other transmitted signals.

Since $X_{0:T}$ forms a Markov chain and $$p(X_{0:T}, y_{1:T}) = \left[ \prod_{i=1}^{T} p(y_t | X_{t-1}, X_t) \cdot p(X_t | X_{t-1}) \right] \cdot p(X_0),$$

the BCJR algorithm can be invoked to evaluate the a posteriori probabilities of the state transitions, which can be mapped to the a posteriori probabilities of the set of antenna symbols transmitted at each time instance. The algorithm we describe can, however, be implemented at a much-reduced practical complexity as explained below.

To account for any prior information about the transmitted symbols, let the prior probabilities of the N different possibilities of each antenna symbol be given by the vector $(p_{t,j}^1, p_{t,j}^2, \ldots, p_{t,j}^N)$ for $t \in [1,T]$ and $j \in [1,m]$.

Figure 2A:
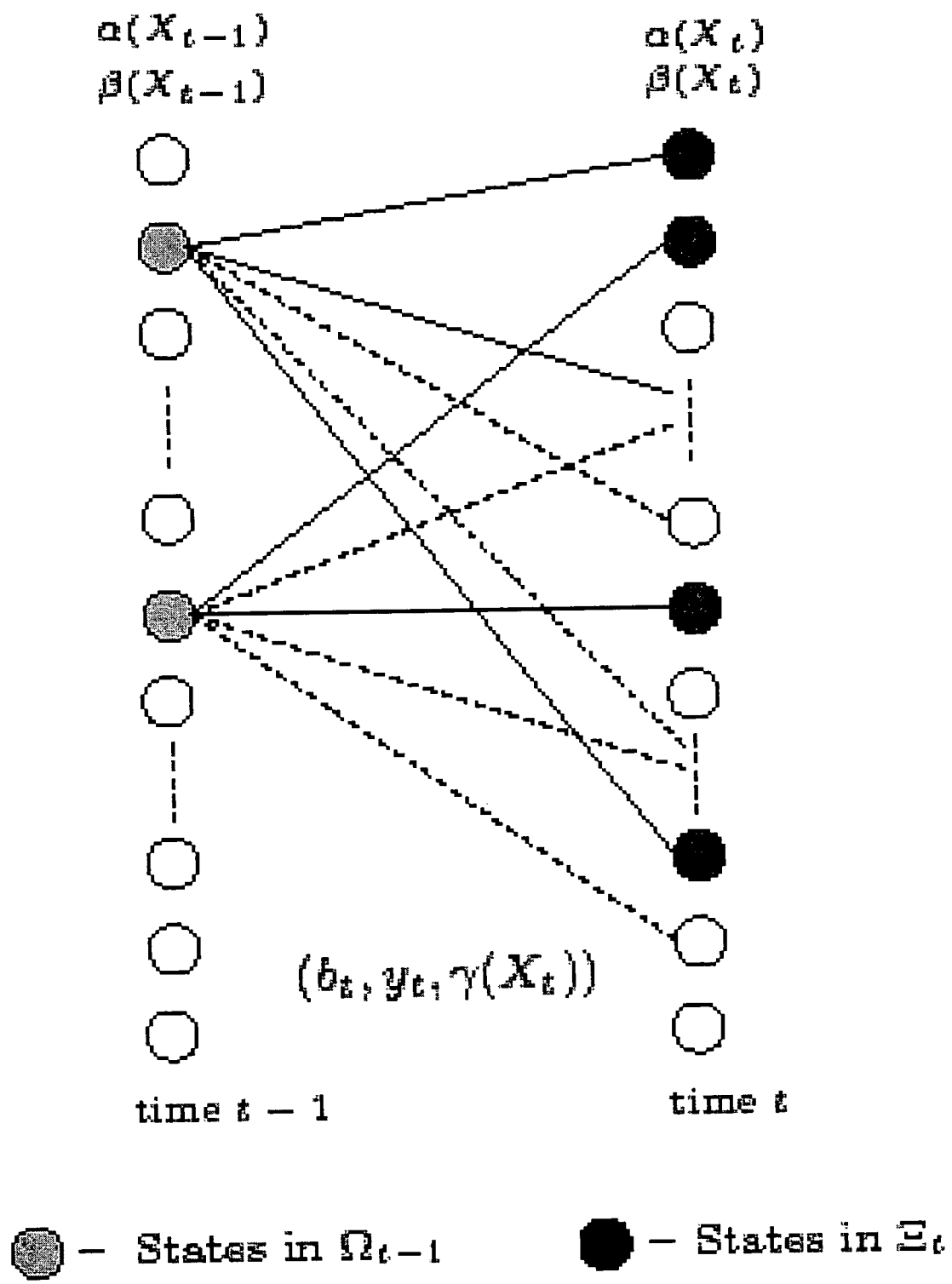
FIGS. 2a to 2c show, respectively, a portion of equalizer trellis according to an embodiment of the present invention, and first and second parts of a flow diagram of a procedure according to an embodiment of the present invention.

The algorithm we describe has a forward recursion and a backward recursion through the trellis similar to the BCJR algorithm. At each time instance in the forward recursion, the algorithm performs two functions: active state selection and the computation and storage of $\alpha(X_t)$ for the active states of time t and $\gamma(X_{t-1}, X_t)$ for state transitions from the active states at times t−1 to t. Let the set of active states selected at time t be represented by $\Omega_t = \{X_t^{(1)}, X_t^{(2)}, \ldots, X_t^{(M)}\}$ and the states that are contending to be active states be represented by $\Xi_t$, as shown in FIG. 2a. Let us also assume a system that is terminated at a predetermined state, for example, state 0 (a trellis terminated system) at the end of the frame.

We next describe active state selection at time t:

The general idea is to estimate the fix lag smoothed density of the states for the states in $\Xi_t$. The following derivations present one simple method of estimating these densities at a low complexity.

We can first make the observation that there are up to $MN^m$ states in $\Xi_t$ corresponding to the state transitions emanating from the M active states of time t−1 (since there are $N^m$ branches emanating from each active state). One method of estimating the fix lag smoothed density of the states in $\Xi_t$ is by, $$p(X_t \mid y_{1:t+L'}) \approx Z \sum_{X_{t-1} \in \Omega_{t-1}} \{\alpha(X_{t-1}) p(b_t \mid X_{t-1}, y_{t:t+L'}) p(y_{t:t+L'} \mid X_{t-1})\} \quad (2)$$

Here Z is the normalization constant of the estimated density of $p(X_t|y_{1:t+L'})$. We can also make the further approximation of assuming that the antenna symbols of time t are independent after the observation of $y_{t:t+L'}$ and given a particular active state of time t−1:

$$p(b_t \mid X_{t-1}, y_{t:t+L'}) \approx \left[\prod_{j=1}^{m} p(b_t^j \mid X_{t-1}, y_{t:t+L'})\right] \quad (3)$$

We will estimate the probabilities $p(b_t^j|X_{t-1},y_{t:t+L'})$ and $p(y_{t:t+L'}|X_{t-1})$ using a Gaussian approximation.

We first consider $p(y_{t:t+L'}|X_{t-1})$.

Observing that:

$$y_{t:t+L'} = Ab + w \quad (4)$$

where the noise vector and the transmitted symbol vector are given by $w=((w_t^1, w_t^2, \ldots, w_{t+L'}^1, \ldots, w_{t-L'}^n)^\dagger$, $b=(b_{t-L}^1, b_{t-L}^2, \ldots, b_{t+L'}^1, \ldots, b_{t+L'}^m)^\dagger$ respectively, and the form of A can be identified from (1). Thus, A is a n(L'+1)×m(L'+L+1) Toeplitz matrix given by:

$$A = \begin{bmatrix} h(L) & h(L-1) & h(L-2) & \cdots & \cdots & h(2) & h(1) & h(0) & 0 & 0 & \cdots & 0 \\ 0 & h(L) & h(L-1) & h(L-2) & \cdots & \cdots & \cdots & h(1) & h(0) & 0 & \cdots & 0 \\ 0 & 0 & h(L) & h(L-1) & h(L-2) & \cdots & \cdots & \cdots & h(1) & h(0) & & \vdots \\ 0 & 0 & 0 & \cdots & & & & & & & & \vdots \\ \vdots & \vdots & \vdots & & \ddots & \ddots & & & & & & \\ 0 & 0 & 0 & & & & & & & h(1) & h(0) \end{bmatrix}$$

where the (n×m) matrix h(d) has ith row and jth column component given by $h^{i,j}(d)$.

Now in the matrix multiplication Ab of (4), there is a column vector of length n(L'+1) associated with each antenna symbol $b_s^l$ for $s \in [t-L, \ldots, t+L']$ and $l \in [1, \ldots, m]$. Let us denote this column vector of A by $h_s^l$ (ie. a symbol $b_s^l$ has a column vector $h_s^l$ associated with it containing information relating to the channel). Now, (4) can be written as:

$$y_{t:t+L'} = \sum_{\substack{s \in \{t-L, \ldots, t-1\} \\ l \in \{1, \ldots, m\}}} h_s^l b_s^l + \sum_{\substack{s \in \{t, \ldots, t+L'\} \\ l \in \{1, \ldots, m\}}} h_s^l b_s^l + w \quad (5)$$

A particular state $X_{t-1}$ renders the $b_s^l$ known for $s \in [t-L, t-1]$ and $l \in [1,m]$. Due to the uncertainty of other antenna symbols, the true distribution of $y_{t:t+L'}$ given $X_{t-1}$ is a mixture of normal distributions. We will approximate this true distribution with a single Gaussian distribution that has the same moments of the true distribution. That is we can say that $p(y_{t:t+L'}|X_{t-i})$ has a multivariate normal distribution with a mean vector $\tilde{\mu}_t$ and a covariance matrix $\tilde{\Sigma}_t$; which can be evaluated by moment matching as:

$$\tilde{\mu}_t = \sum_{\substack{s \in \{t-L, \ldots, t-1\} \\ l \in \{1, \ldots, m\}}} h_s^l b_s^l + \sum_{\substack{s \in \{t, \ldots, t+L'\} \\ l \in \{1, \ldots, m\}}} h_s^l E(b_s^l) \quad (6)$$

and $$\tilde{\Sigma}_t = \Sigma + \sum_{\substack{s \in \{t, \ldots, t+L'\} \\ l \in \{1, \ldots, m\}}} h_s^l (h_s^l)^H \mathrm{Var}(b_s^l) \quad (7)$$

where $\Sigma$ is the covariance matrix of w and $(\cdot)^H$ denotes conjugate transpose operation ($\tilde{\mu}_t$ is a vector of length n(L'+1) and $\tilde{\Sigma}_t$ is a n(L'+1)×n(L'+1) matrix).

The a priori mean and variance of the unknown antenna symbols can be evaluated by:

$$E(b_s^l) = \sum_{k=1}^{N} a_k \cdot p_{s,l}^k \quad (8)$$

and $$\mathrm{Var}(b_s^l) = \sum_{k=1}^{N} |a_k|^2 \cdot p_{s,l}^k - |E(b_s^l)|^2 \quad (9)$$

Here $p_{s,i}^k$ is probability of the symbol transmitted by the $l^{th}$ antenna at time index s, $b_s^l$ for $s \in [t, t+L']$ and $l \in [1,m]$ being the symbol $\alpha_k$ for $k \in [1,N]$. Equal symbol probabilities may be assumed unless other information is available, for example from a previous iteration of the decoding procedure and/or from a channel decoder.

Therefore for the particular received sequence $y_{t:t+L'}$, the probability $p(y_{t:t+L'}|X_{t-1})$ can be estimated as follows:

$$p(y_{t:t+L'} \mid X_{t-1}) \approx \frac{1}{(\pi)^{n(L'+1)} |\tilde{\Sigma}_t|} \exp\left[(-1)(y - \tilde{\mu}_t)^H (\tilde{\Sigma}_t)^{-1} (y - \tilde{\mu}_t)\right] \quad (9a)$$

We next consider $p(b_t^j|X_{t-1},y_{t:t+L'})$.

Thus, similarly for the estimation of $p(b_t^j|X_{t-1},y_{t:t+L'})$, we will try to fit a single normal distribution to the distribution of $b_t^j$ given $X_{t-1}$ and $y_{t:t+L'}$, such that it is moment matched to the true discrete distribution. Thereby rewriting Equation (4) as $$h_t^j b_t^j = y_{t:t+L'} - \left[ \sum_{\substack{s \in \{t-L, \ldots, t-1\} \\ l \in \{1, \ldots, m\}}} h_s^l b_s^l + \sum_{\substack{s \in \{t, \ldots, t+L'\} \\ l \in \{1, \ldots, m\} \\ (s,l) \neq (t,j)}} h_s^l b_s^l + w \right],$$

and again noting that particular state $X_{t-1}$ renders the $b_s^l$ known for $s \in [t-L, t-1]$ and $l \in [1,m]$, we can assume that $p(h_t^j b_t^j | X_{t-1}, y_{t:t+L'})$ is having a normal distribution with the corresponding mean $\hat{\mu}_{t,j}$ and covariance $\hat{\Sigma}_{t,j}$ given by:

$$\hat{\mu}_{t,j} = y_{t:t+L'} - \sum_{\substack{s \in \{t-L, \ldots, t-1\} \\ l \in \{1, \ldots, m\}}} h_s^l b_s^l + \sum_{\substack{s \in \{t, \ldots, t+L'\} \\ l \in \{1, \ldots, m\} \\ (s,l) \neq (t,j)}} h_s^l E(b_s^l) + w \text{ and}$$

$$\hat{\Sigma}_{t,j} = \Sigma + \sum_{\substack{s \in \{t, \ldots, t+L'\} \\ l \in \{1, \ldots, m\} \\ (s,l) \neq (t,j)}} h_s^l (h_s^l)^H \text{Var}(b_s^l).$$

Thus for known $h_t^j$ and for any particular $b_t^j$, $p(b_t^j | X_{t-1}, y_{t:t+L'})$ can be estimated:

$$p(b_t^j | X_{t-1}, y_{t:t+L'}) \approx \qquad (9b)$$

$$\frac{1}{(\pi)^{n(L'+1)} |\hat{\Sigma}_{t,j}|} \exp\left[(-1)(h_t^j b_t^j - \hat{\mu}_{t,j})^H (\hat{\Sigma}_{t,j})^{-1} (h_t^j b_t^j - \hat{\mu}_{t,j})\right]$$

Now, for a given state $X_{t-1}$, the state transition to time instance t is determined by the transmitted space-time symbol $b_t$. Here as a further method of reducing the system complexity the algorithm selects S transitions from each of the M states at time t−1 using the estimation of the density $p(b_t | X_{t-1}, y_{t:t+L'})$ given by (3) (and (9b)), selecting the most likely transitions ie. those with the largest probabilities. Therefore $\Xi_t$ has up to MS states. We evaluate $p(X_t | y_{1:t+L'})$ for these states (equation (2)) and select M distinct states at time t that have the largest fixed lag smoothed probability and include them in $\Omega_t$.

We now describe the computation of $\alpha(X_t)$ and $\gamma(X_{t-1}, X_t)$. For the selected states in $\Omega_t$, $\alpha(X_t)$ is computed by $$\alpha(X_t) = \sum_{X_{t-1} \in \Omega_{t-1}} \alpha(X_{t-1}) \gamma(X_{t-1}, X_t) \qquad (10)$$

where $\gamma(X_{t-1}, X_t)$ is computed as $$\gamma(X_{t-1}, X_t) = p(y_t | X_{t-1}, X_t) p(X_t | X_{t-1}) \qquad (11a)$$

This in our case can be computed as:

$$\gamma(X_{t-1}, X_t) = \qquad (11b)$$

$$\left[\frac{1}{(\pi)^n \sigma^2} \exp\left\{-\frac{1}{\sigma^2} \sum_{i=1}^{n} \left| y_t^j - \sum_{d=0}^{L} \sum_{j=1}^{m} h^{i,j}(d) \cdot b_{t-d}^j \right|^2 \right\} \right] \cdot p(b_t)$$

Where $p(b_t)$ is the prior probability of the space-time symbol $b_t$ which is transmitted from the state transition relevant to $(X_{t-1}, X_t)$. In the absence of better information the space-time symbols may be considered equally likely.

In the backward recursion of the algorithm, $\beta(X_t)$ is computed for each state in $\Omega_t$ using the relation:

$$\beta(X_t) = \sum_{X_{t+1} \in \Omega_{t+1}} \beta(X_{t+1}) \gamma(X_t, X_{t+1}) \qquad (12)$$

Taking $\zeta(b_t)$ to denote the set of state transitions that results in the transmission of the particular space-time symbol $b_t$, the A Posteriori probability of the space-time symbols at time instant t are computed by $$p(b_t | y_{1:T}) = Z' \sum_{\substack{X_{t-1} \in \Omega_{t-1}, X \in \Omega_t \\ (X_{t-1}, X_t) \in \zeta(b_t)}} \alpha(X_{t-1}) \gamma(X_{t-1}, X_t) \beta(X_t) \qquad (13)$$

Again, Z' is the normalization constant of the estimated density of $p(b_t | y_{1:T})$. The a posteriori probability of each antenna symbol can be computed from these computed posterior probabilities of the space-time symbols as follows. Let us say the a posteriori probability density of the symbols transmitted by the antenna j at time instant t is given by the vector $(q_{t,j}^1, q_{t,j}^2, \ldots, q_{t,j}^N)$, where $q_{t,j}^k$ is the posterior probability of the particular antenna symbol being $\alpha_k$, for $k \in [1,N]$. Then $q_{t,j}^k$ for every $t \in \{1, \ldots, T\}$, $j \in \{1, \ldots, m\}$ and $k \in \{1, \ldots, N\}$ can be calculated by summing space-time symbol probabilities over all the space-time symbols that result in the transmission of the antenna symbol $\alpha_k$ from antenna j.

Where bitwise probability values are desired the probability of a particular bit having a particular binary value may be obtained by summing symbol probabilities over all the symbols in which that bit has that particular binary value.

Figure 2B:
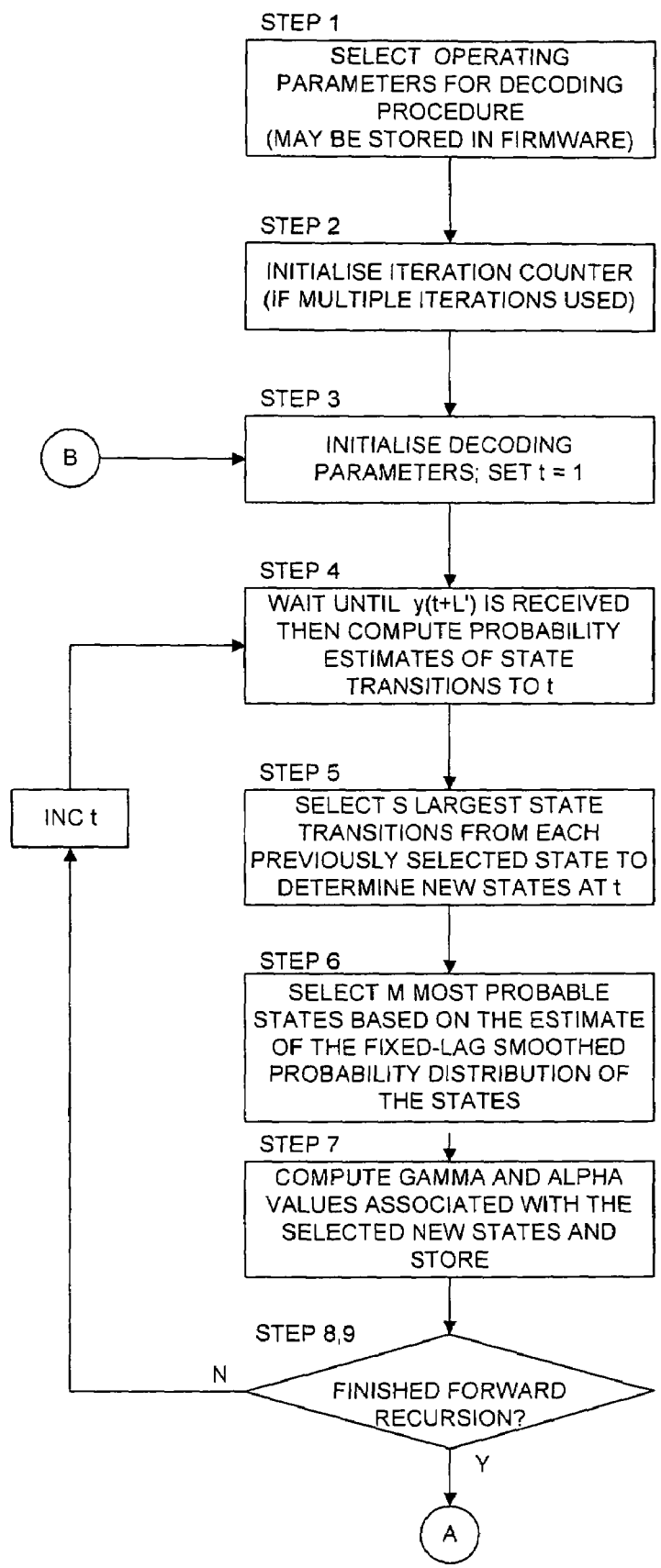
Figure 2C:
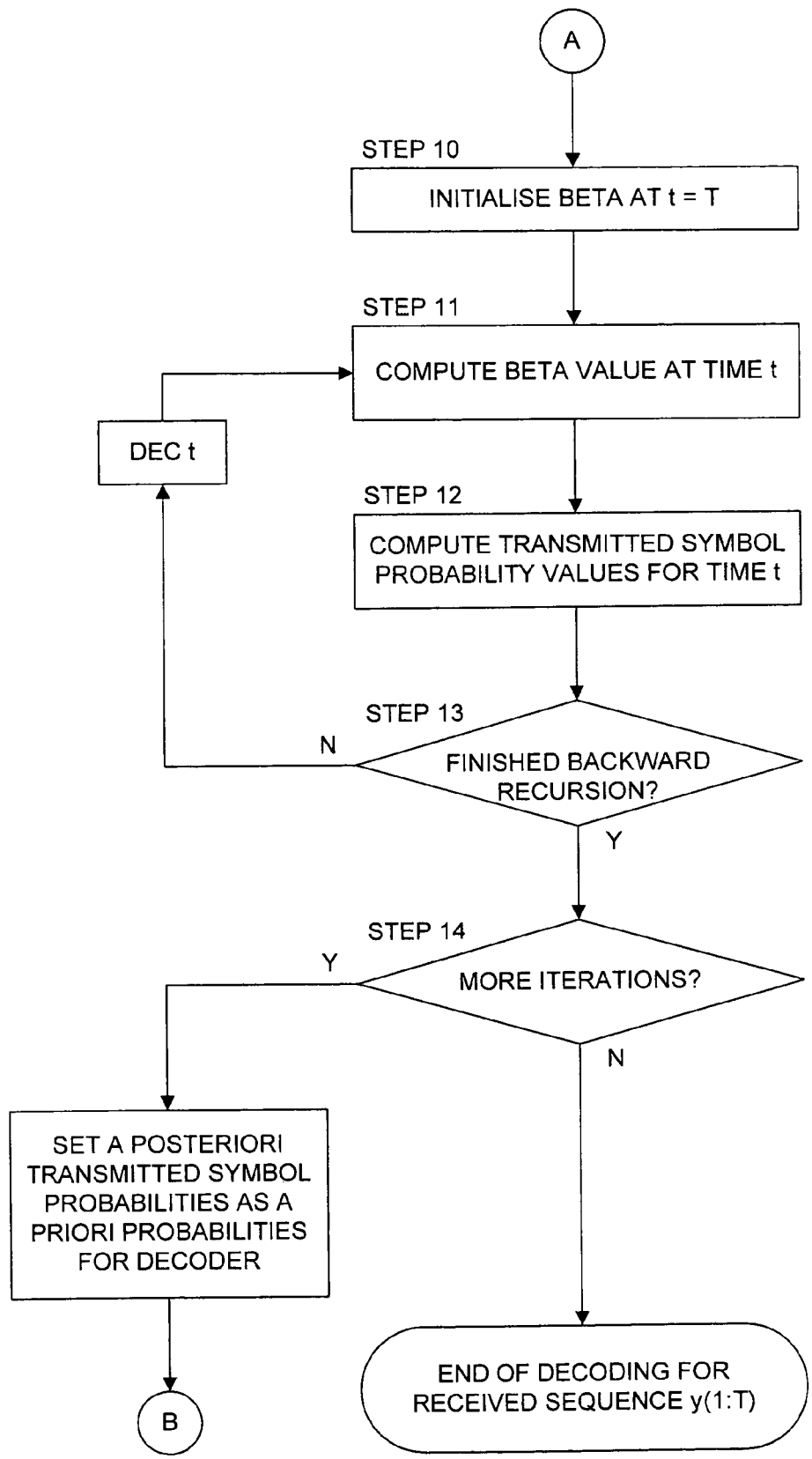

We next describe pseudo code for implementing an embodiment of the invention for the equalization of a spatially multiplexed system. Reference may also be made to FIGS. 2b and 2c, which summarise the steps of the procedure (in FIGS. 2b and 2c the numbering of the steps corresponds to that given below). We assume that $N_{it}$ number of iterations of the proposed algorithm is performed (though in some embodiments $N_{it}$ may equal one).

Step 1: Select the parameters L', M, S and $N_{it}$.
Step 2: Set the iteration counter $C_{it}$ to 1.
Step 3: Set t=1. Set $X_0^{(h)}=0$ (or some other starting state) for h=1, . . . ,M and set $\alpha(X_0=0)=1$ and $\alpha(X_0 \neq 0)=0$.
Step 4: When $y_{t+L'}$ is received, compute the estimates of $p(y_{t:t+L'}|X_{t-1})$ and $p(b_t^j|X_{t-1}, y_{t:t+L'})$ for every $j \in [1,m]$, $X_{t-1} \in \Omega_{t-1}$ and $b_t^j \in B$ using the Gaussian approximations described in Equation (9a) and (9b). Compute $p(b_t|X_{t-1}, y_{t:t+L'})$ from Equation (3).
Step 5: For each $X_{t-1} \in \Omega_{t-1}$, select the S largest $p(b_t|X_{t-1}, y_{t:t+L'})$ and consider the corresponding state transitions to be active. Thereby determine the states of $\Xi_t$.
Step 6: Compute the estimate of $p(X_t|y_{1:t+L'})$ for every state $X_t \in \Xi_t$ using (2). Select the M distinct states that have the largest fix lag-smoothed probability and include them in $\Omega_1$.
Step 7: Compute $\gamma(X_{t-1}, X_t)$ using (11b) for every $X_{t-1} \in \Omega_{t-1}$, $X_t \in \Omega_t$ and $\alpha(X_t)$ using (10) for every $X_t \in \Omega_t$. Store these values.
Step 8: If t<T−L', increase t by one and go to Step 4, otherwise continue to Step 9.
Step 9: If T−L'≤t<T, increase t by one, consider $y_{t+L'}$ to be received as value 0 and go to Step 4; otherwise continue to Step 10.

Step 10: If the state 0 is included in $\Omega_T$, set $\beta(X_T=0)=1$ and $\beta(X_T\neq 0)=0$ (set $\beta$ mutatis mutandis for some other finishing state); otherwise set $\beta(X_T)=1$ for all $X_T \in \Omega_T$.

Step 11: Compute $\beta(X_{t-1})$ for every $X_{t-1} \in \Omega_{t-1}$ using (12).

Step 12: Compute $p(b_t|y_{1:T})$ for every possible space-time symbol using (13).

Compute the posterior probabilities of the antenna symbols from these a posteriori probabilities of the space-time symbols.

Step 13: if t>1, decrease t by one and go to Step 11, otherwise continue to Step 14.

Step 14: if $C_{it}<N_{it}$, increase $C_{it}$ by one, consider the computed a posteriori probabilities of the antenna symbols as their a priori probabilities and go to Step 3; otherwise Stop.

We next describe how the computational complexity of the procedure may be reduced by using the Jacobian logarithm to represent the probabilities in logarithmic form.

The evaluation of probabilities $\alpha(X_t)$, $\beta(X_t)$, $\gamma(X_{t-1},X_t)$ and $p(b_t|y_{1:T})$ can be represented in the logarithmic form to invoke the Jacobian logarithmic approximation, $$\ln(\exp(a) + \exp(b)) \approx J(a, b) \quad (14)$$
$$\approx \max(a, b) + \ln(1 + \exp(-|a-b|))$$
$$\approx \max(a, b) + LUT(|a-b|),$$

in order to reduce the computational complexity. Here, the Jacobian logarithmic function could employ the look up table LUT(•) to approximate $\ln(1+\exp(-|a-b|))$.

Therefore the forward, backward and transition probabilities are modified from Equation (10)-(13) to:

$$A(X_t) = \ln(\alpha(X_t)) \quad (15)$$
$$= \ln\left[\sum_{X_{t-1}\in\Omega_{t-1}} \exp[A(X_{t-1}) + \Gamma(X_{t-1}, X_t)]\right]$$

$$B(X_t) = \ln(\beta(X_t))$$
$$= \ln\left[\sum_{X_{t+1}\in\Omega_{t+1}} \exp[B(X_{t+1}) + \Gamma(X_t, X_{t+1})]\right]$$

$$\Gamma(X_{t-1}, X_t) = \ln(\gamma(X_{t-1}, X_t))$$
$$= -\ln(\pi\sigma^2) - \frac{1}{\sigma^2}\sum_{i=1}^{n}\left|y_t^j - \sum_{d=0}^{L}\sum_{j=1}^{m} h^{i,j}(d) \cdot b_{t-d}^j\right|^2 +$$
$$\ln[p(b_t)]$$

$$Lpr(b_t) = \ln[p(b_t|y_{1:T})]$$
$$= \ln\left[\sum_{\substack{X_{t-1}\in\Omega_{t-1}, X_t\in\Omega_t \\ (X_{t-1},X_t)\in\zeta(b_t)}} \exp[A(X_{t-1}) + \Gamma(X_{t-1}, X_t) + B(X_t)]\right] - Z'.$$

Here Z" is the normalization constant such that $p(b_t|y_{1:T})$ is a proper density. The selection of active states and state transitions according to Steps 5 and 6 in the above pseudo-code invoke Equations (9a) and (9b) that employs exponential function, which is costly for implementation. This can be avoided as explained below.

The selection of active states $\Xi_t$ involves selecting S active state transition with largest $p(b_t|X_{t-1},y_{t:t+L'})$ Here, referring to Equation (3) and (9b), the probability $p(b_t|X_{t-1},y_{t:t+L'})$ can be represented as:

$$p(b_t | X_{t-1}, y_{t:t+L'}) \propto \exp\left\{-\frac{1}{2}\sum_{j=1}^{m}(h_t^j b_t^j - \hat{\mu}_{t,j})^H \hat{\Sigma}_{t,j}^{-1}(h_t^j b_t^j - \hat{\mu}_{t,j})\right\} \quad (16)$$

Therefore, the active state transition selection can be invoked by choosing the state transition with S lowest metrics $$\Phi = \sum_{j=1}^{m}(h_t^j b_t^j - \hat{\mu}_{t,j})^H \hat{\Sigma}_{t,j}^{-1}(h_t^j b_t^j - \hat{\mu}_{t,j}) \quad (17)$$

Here, the computation of the metrics $\Phi$ is less costly than the full evaluation of $p(b_t|X_{t-1},y_{t:t+L'})$ in Equation (16).

Similarly the active state selection is based on $$p(X_t | y_{1:t+L'}) \propto \sum_{X_{t-1}\in\Omega_{t-1}} \{\alpha(X_{t-1})p(b_t|X_{t-1}, y_{t:t+L'})p(y_{t:t+L'}|X_{t-1})\}$$
$$\propto \sum_{X_{t-1}\in\Omega_{t-1}} \left\{\exp\left[A(X_{t-1}) - \frac{1}{2}\Phi(b_t, X_{t-1}, y_{t+t:L'}) - \frac{1}{2}\Psi(y_{t+t:L'}, X_{t-1})\right]\right\}$$
$$= \sum_{X_{t-1}\in\Omega_{t-1}} \exp[\Theta(X_t; X_{t-1}, b_t, y_{t+t:L'})]$$

where referring to Equation (9a), the logarithmic term corresponding to $p(y_{t:t+L'}|X_{t-1})$ is given by $\Psi(y_{t:t+L'},X_{t-1})=(y_{t:t+L'}-\tilde{\mu}_t)^H(\tilde{\Sigma}_t)^{-1}(y_{t:t+L'}-\tilde{\mu}_t)$.

Now taking the log probabilities, $$LPr(X_t | y_{1:t+L'}) = \ln\sum_{X_{t-1}\in\Omega_{t-1}}\exp[\Theta(X_t; X_{t-1}, b_t, y_{t+t:L'})] - Z''' \quad (18)$$

where Z" is the normalization constant such that $p(X_t|y_{1:t+L'})$ is a proper density. Here, the computational simplifications due to the Jacobian logarithm approximation can be used to evaluate (18). An alternative further reduced complexity but less accurate method of active state selection is to select M distinct states that have the largest metric $\Theta(X_t;X_{t-1},b_t,y_{t+t:L'})$.

We next describe how the computational complexity of the procedure may be additionally or alternatively reduced by using the matrix inversion lemma.

The computation of the inversions of the matrices $\hat{\Sigma}_{t,j}$ and $\tilde{\Sigma}_t$ for each transmit antenna and for each time instant can be a computationally intensive task. One method of avoiding computing these inversions at each time instance in the case of implementations with uniform prior distributions for the space-time symbols and when the total state space is very large (eg in MIMO systems) is to increase the number of active states (M) instead of going into an iterative implementation. Inversions of the matrices $\hat{\Sigma}_{t,j}$ and $\tilde{\Sigma}_t$ become time instance dependent only in the presence of a non-uniform prior distribution on the symbols as, for example could result from Step 14 of the above pseudo-code procedure.

When these matrices inversions are necessary for each time instance, their computational complexity can be reduced using the following technique.

We can write $$\tilde{\Sigma}_{t+1} = \tilde{\Sigma}_t - \sum_{j=1}^{m} h_t^j \cdot (h_t^j)^H \text{Var}(b_t^j) +$$

$$\sum_{j=1}^{m} h_{t+L'+1}^j \cdot (h_{t+L'+1}^j)^H \text{Var}(b_{t+L'+1}^j)$$

$$= \tilde{\Sigma}_t + \sum_{q=1}^{2m} u_q (u_q)^H \lambda_q$$

When $$u_q = \begin{cases} h_t^q; & q \in [1, m] \\ h_{t+L'+1}^{q-m}; & q \in [m+1, 2m] \end{cases}$$

and $$\lambda_q = \begin{cases} -\text{Var}(b_t^q); & q \in [1, m] \\ \text{Var}(b_{t+L'+1}^{q-m}); & q \in [m+1, 2m] \end{cases}$$

Now, without directly calculating the inverse $(\tilde{\Sigma}_{t+1})^{-1}$, we can sequentially calculate the effect on the inverse of $\tilde{\Sigma}_t$ by the addition of the components in (19). For example let, $$\tilde{\Sigma}_{t,k} = \begin{cases} \tilde{\Sigma}_t; & k = 0 \\ \tilde{\Sigma}_t + \sum_{q=1}^{k} u_q (u_q)^H \lambda_q; & k \in [1, 2m] \end{cases}$$

Of course it is $\tilde{\Sigma}_{t,2m} = \tilde{\Sigma}_{t+1}$ whose inverse we are interested in. Now say we have the inverse of $\tilde{\Sigma}_{t,k}$ for some $k \in [0, 2m-1]$. Then $(\tilde{\Sigma}_{t,k+1})^{-1} = (\tilde{\Sigma}_{t,k} + u_{k+1}(u_{k+1})^H \lambda_{k+1})^{-1}$ can be computed as $$(\tilde{\Sigma}_{t,k+1})^{-1} = (\tilde{\Sigma}_{t,k})^{-1} - (\tilde{\Sigma}_{t,k})^{-1} \left[ \frac{u_{k+1}(u_{k+1})^H \lambda_{k+1}}{(1 + \lambda_{k+1}(u_{k+1})^H (\tilde{\Sigma}_t)^{-1} u_{k+1})} \right] (\tilde{\Sigma}_{t,k})^{-1} \quad (20)$$

From which method we can end up with $(\tilde{\Sigma}_{t+1})^{-1}$.

The recursive calculations of $\hat{\Sigma}_{t,j}$ follow similarly. In fact, the inverse of $\hat{\Sigma}_{t,j}$ can be computed more efficiently using the inverse of $\tilde{\Sigma}_t$, by observing that $$\hat{\Sigma}_{t,j} = \tilde{\Sigma}_t - h_t^j (h_t^j)^H \text{Var}(b_t^j) \quad (21)$$

From which we can get:

$$(\hat{\Sigma}_{t,j})^{-1} = (\tilde{\Sigma}_t)^{-1} + (\tilde{\Sigma}_t)^{-1} h_t^j (h_t^j)^H (\tilde{\Sigma}_t)^{-1} \left[ \frac{\text{Var}(b_t^j)}{(1 - \text{Var}(b_t^j)(h_t^j)^H (\tilde{\Sigma}_t)^{-1} h_t^j)} \right] \quad (22)$$

The BCJR algorithm includes forward and backward recursion through the trellis to determine the probabilities for the estimated symbols. To further reduce the computational complexity, the backward recursion of the algorithm can be ignored and thus the contribution of the backward recursion metrics $\beta(X_t)$ in the computation of the a posteriori probability of the space-time symbols in Equation (13) is not included. Therefore this reduced complexity version is similar to the soft output Viterbi algorithm which finds the best survivor path in the trellis.

Figure 3:
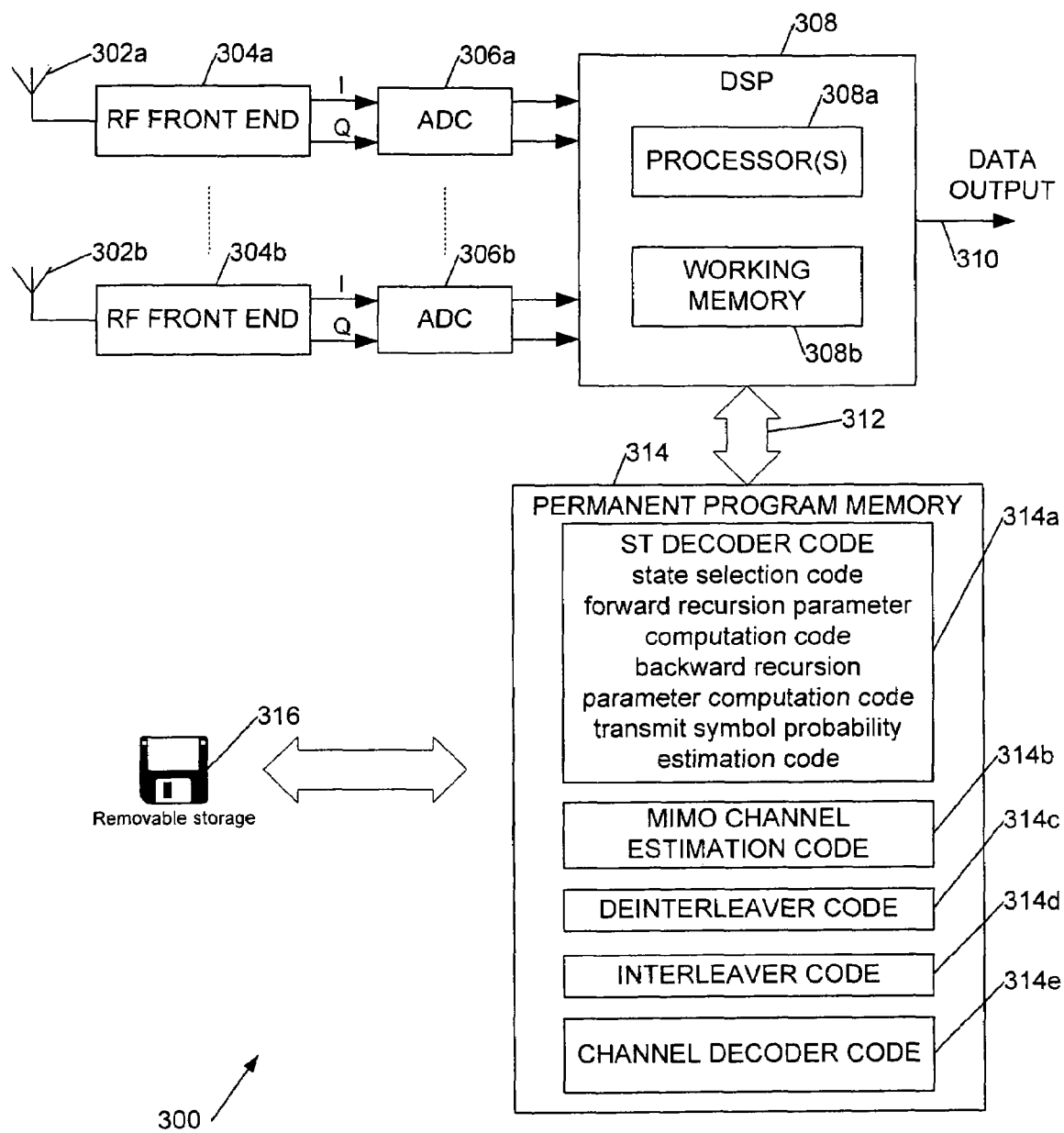
FIG. 3 shows a receiver incorporating an embodiment of a decoder in accordance with the present invention.

FIG. 3 shows a receiver 300 incorporating an embodiment of a decoder in accordance with the invention.

Receiver 300 comprises one or more receive antennas 302a, b (of which two are shown in the illustrated embodiment) each coupled to a respective rf front end 304a, b, and thence to a respective analogue-to-digital converter 306a,b and to a digital signal processor (DSP) 308. DSP 308 will typically include one or more processors 308a (for example, for a parallel implementation) and some working memory 308b. The DSP 308 has a data output 310 and an address, data and control bus 312 to couple the DSP to permanent program memory 314 such as flash RAM or ROM. Permanent program memory 314 stores code and optionally data structures or data structure definitions for DSP 308.

In the illustrated example program memory 314 includes trellis-based BCJR-type (space time) decoder code 314a comprising state selection code, forward recursion parameter computation code, backward recursion parameter computation code, and transmit symbol probability estimation code to, when running on DSP 308, implement corresponding functions as described above. Program memory 314 also includes MIMO channel estimation code 314b to provide a MIMO channel estimate H, and optionally (depending upon the type of encoding applied) de-interleaver code 314c, interleaver code 314d, and channel decoder code 314e. Examples of suitable code 314e are well known to those skilled in the art. In other embodiments, as illustrated with reference to FIGS. 4 to 7, the decoder code may additionally or alternatively implement channel decoding and equalisation. The skilled person will also appreciate that embodiments of the described decoder may be applied in many types of communication system, not just MIMO systems.

Optionally the code in permanent program memory 314 may be provided on a carrier such as an optical or electrical signal carrier or, as illustrated in FIG. 3, a floppy disk 316.

The data output 310 from DSP 308 is provided to further data processing elements of receiver 300 (not shown in FIG. 3) as desired. These may include a baseband data processor for implementing higher level protocols.

The receiver front-end will generally be implemented in hardware whilst the receiver processing will usually be implemented at least partially in software, although one or more ASICs and/or FPGAs may also be employed. The skilled person will recognise that all the functions of the receiver could be performed in hardware and that the exact point at which the signal is digitised in a software radio will generally depend upon a cost/complexity/power consumption trade-off.

Figure 4:
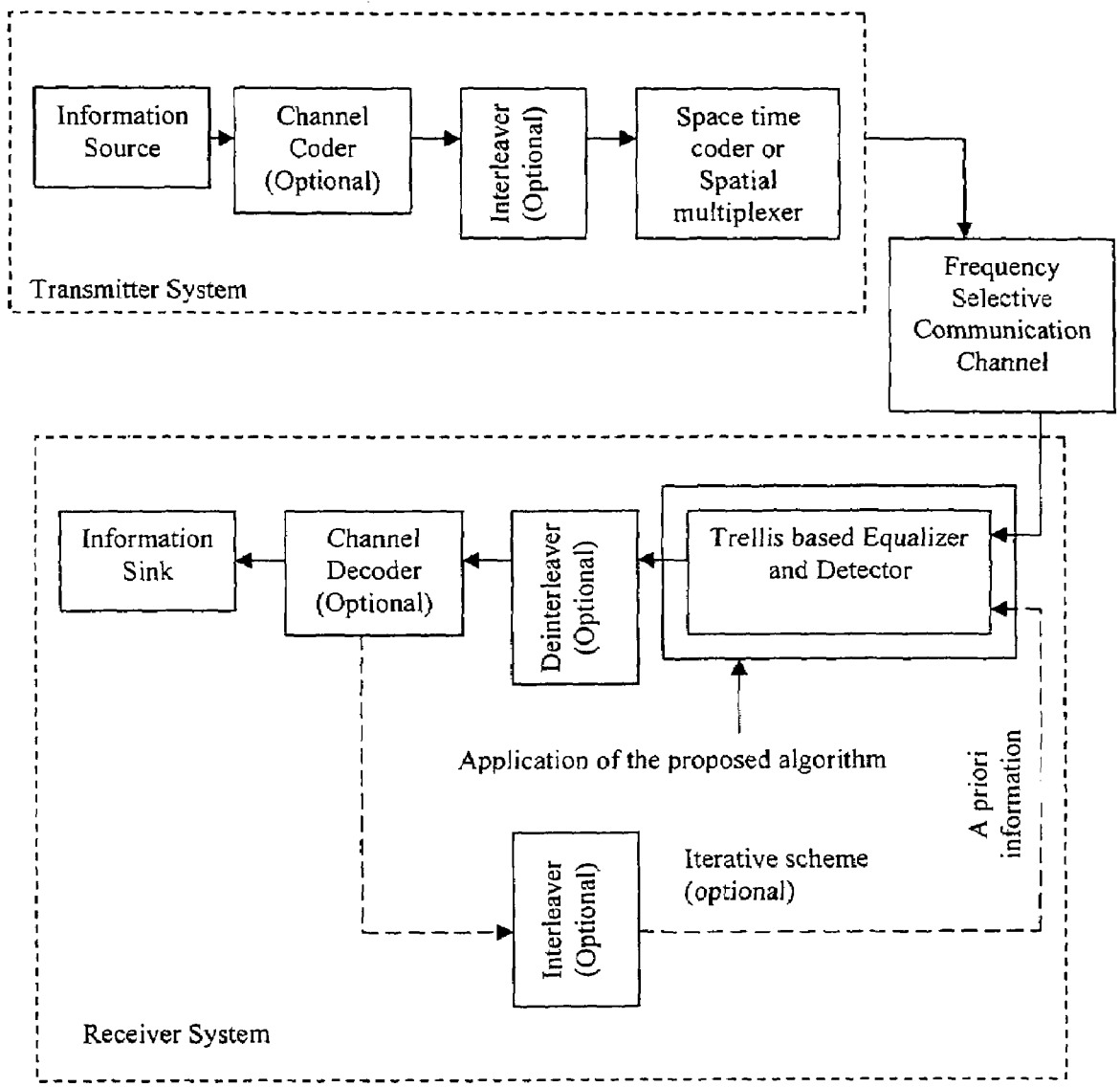
FIG. 4 shows a block diagram of a communications system incorporating an embodiment of a decoder according to the present invention configured for the equalisation of space-time coded and/or spatially multiplexed signals transmitted over a frequency selective channel.
Figure 5:
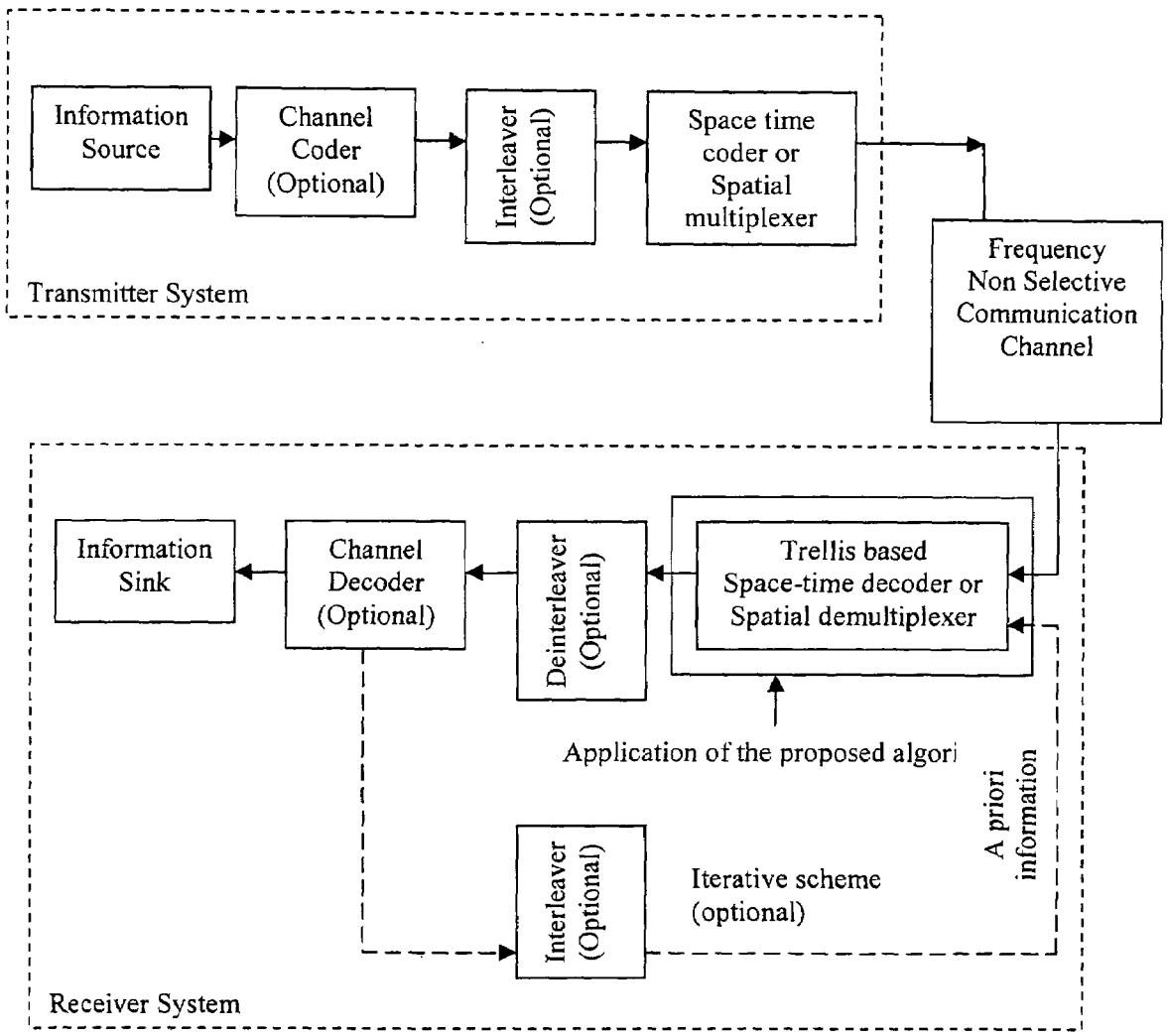
FIG. 5 shows a block diagram of a communications system incorporating an embodiment of a decoder according to the present invention configured for the detection of space-time coded and/or spatially multiplexed signals transmitted over a flat fading channel.
Figure 6:
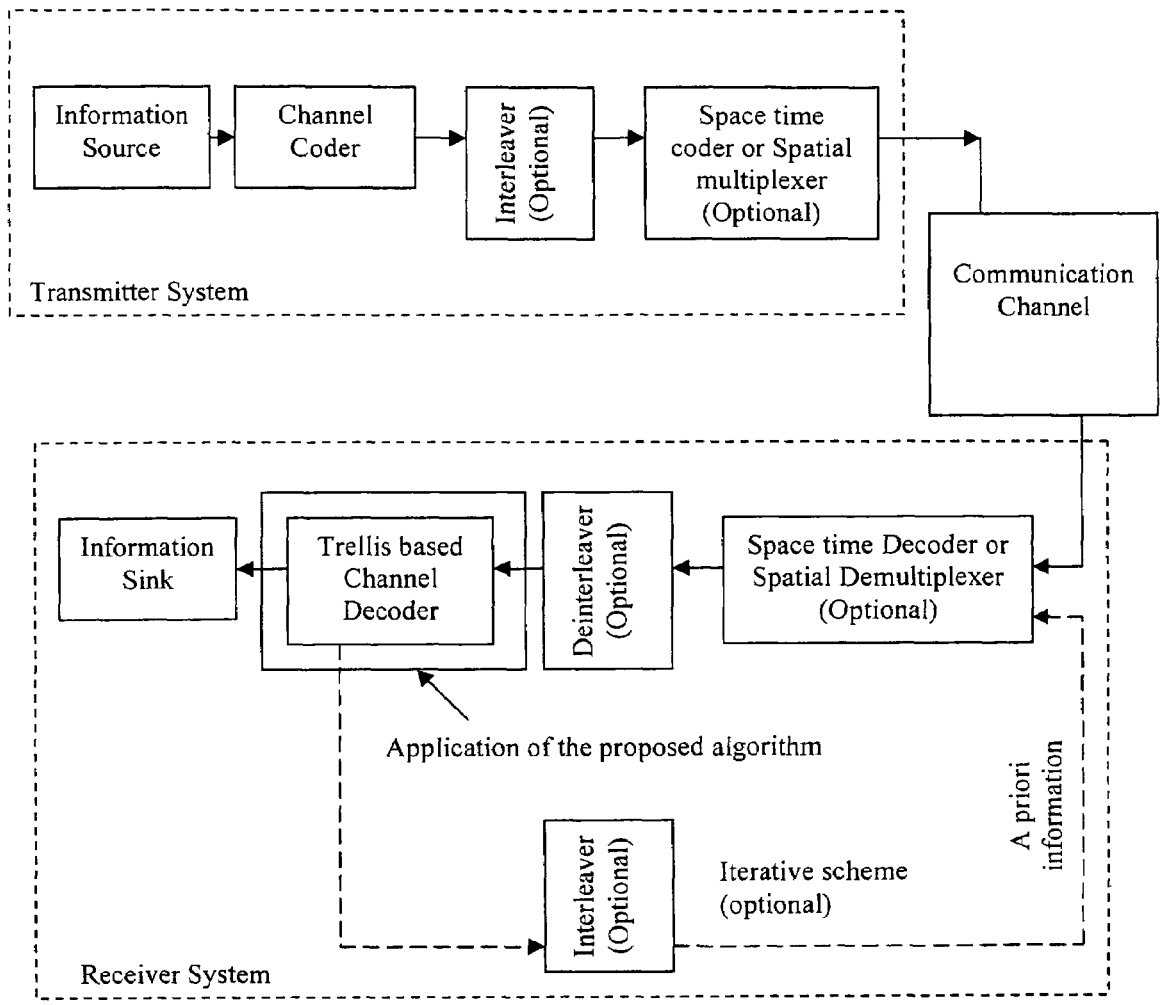
FIG. 6 shows a block diagram of a communications system incorporating an embodiment of a decoder according to the present invention configured for trellis-based channel decoding.
Figure 7:
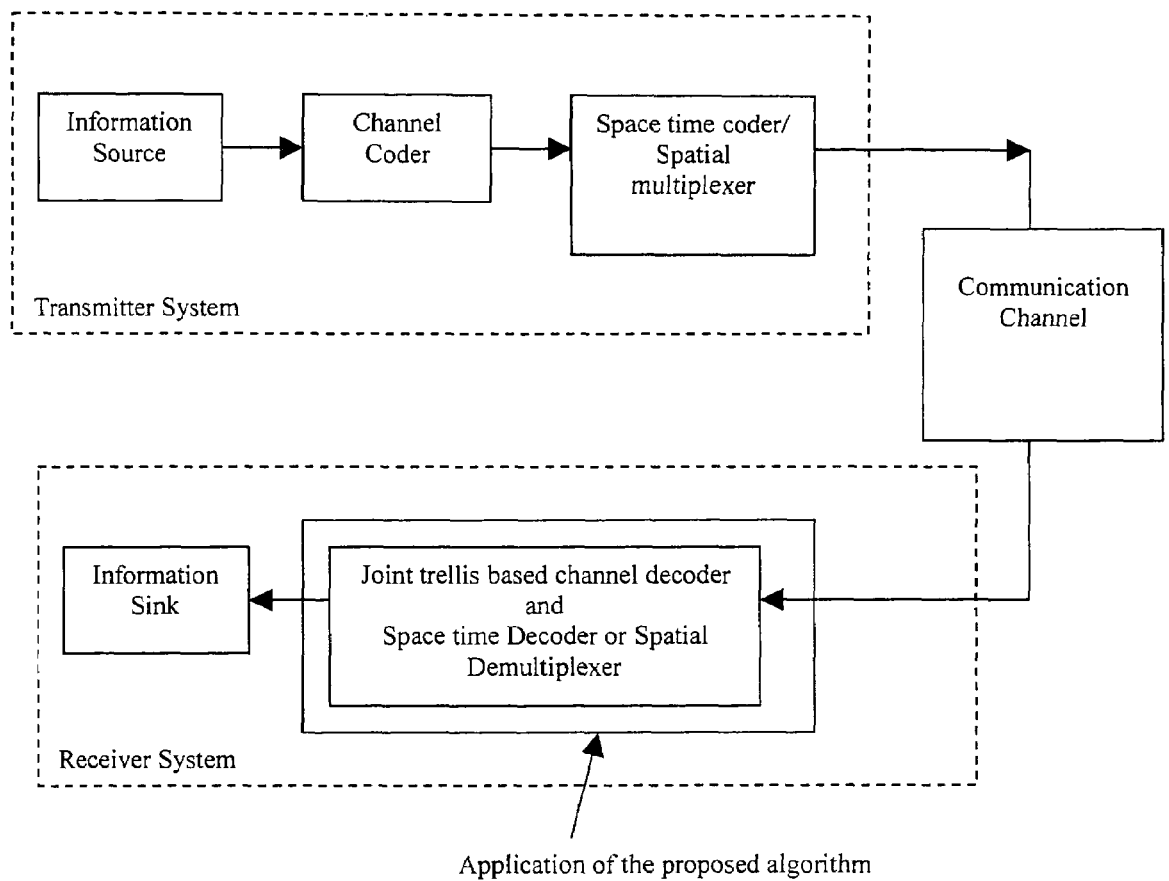
FIG. 7 shows a block diagram of a communications system incorporating an embodiment of a decoder according to the present invention configured for the joint trellis-based decoding of the combined effect of a channel coder and a space-time coder and/or spatial multiplexer.

FIGS. 4 to 7 show some examples of applications of the above described decoder/method in MIMO systems. The examples are non-exhaustive and the same examples are applicable to communication systems with a single transmit antenna. Thus FIG. 4 shows application of the above decoding procedure for the equalisation of space-time coded and/or spatially multiplexed signals transmitted over a frequency selective channel, FIG. 5 shows application of the above decoding procedure for the detection of space-time coded and/or spatially multiplexed signals transmitted over a flat fading channel, FIG. 6 shows application of the above decoding procedure for trellis-based channel decoding, and FIG. 7 shows application of the above decoding procedure for the joint trellis-based decoding of the combined effect of a channel coder and a space-time coder and/or spatial multiplexer.

FIGS. 8a and 8b show graphs of (uncoded) bit error rate (BER, FIG. 8a) and (uncoded) frame error rate (FER, FIG. 8b) against signal-to-noise ratio in dB. The graphs show the results of a simulation of a 2×2 (two transmit antenna, two receive antenna) system in a 5-tap quasistatic Rayleigh fading channel, each transmit antenna transmitting BPSK (binary phase shift keying) modulated symbols.

The graphs compare a full BCJR procedure (curve 800), M-BCJR according to the prior art (Franz and Anderson) with four (curve 802) and sixteen (curve 804) active states per trellis stage, and an embodiment of the algorithm as described above with M=4 and L'=3L (curve 806); S was set to the maximum value of 4. It can be seen that the procedure we describe remarkably achieves near optimal performance (without consideration of the channel decoder) by considering only 4 active states, whereas the optimal equalizer has a total of 256 states and the prior art M-BCJR with 16 active states performs less well.

FIGS. 9a to 9d show graphs of uncoded and coded bit error rate (BER, FIGS. 9a and 9c respectively) and uncoded and coded frame error rate (FER, FIGS. 9b and 9d respectively), against signal-to-noise ratio in dB. The graphs show the results of a simulation of a 1×1 (single transmit antenna, single receive antenna) system transmitting 8PSK symbols into a 3-tap channel (curves 9xxa), a 5-tap channel (curves 9xxb), and a 10-tap channel (curves 9xxc).

The optimal BCJR equalizers for the respective 3, 5 and 10-tap channels have a total of 64, 4096 and over 134 million states. As optimal equalization is computationally impossible we compared the performance of an embodiment of the above described procedure with a conventional soft output MMSE (minimum mean square error) equalization technique (M. S. Yee, M. Sandell, and Y. Sun, "Comparison study of single-carrier and multi-carrier modulation using iterative based receiver for MIMO system," in *Proc. IEEE VTC Spring* 04, Milan, Italy, May 2004). Thus the graphs compare the performance of conventional soft output MMSE equalization (curves 900) with the performance of an embodiment of the algorithm as described above with M=8 (for the 3-tap channel; curves 902), M=16 (for the 5-tap channel; curves 904), and M=64 (for the 10-tap channel; curves 906); S was set to the maximum value of 8. It can be seen that embodiments of the above procedure achieve better performance than the linear MMSE scheme by considering only 8, 16 and 64 active states in the respective cases.

Thus it can be seen that for these examples, of equalization in a communication system, the systems we describe are able show relative invariance of performance when the energy distribution of the channel changes. Moreover the number of active states required for good performance shows little increase with the increase in channel memory, even though the total number of states of the trellis increases exponentially.

We have illustrated the equalization of spatial multiplexed systems, and the single Gaussian approximations used for the low complexity estimation of the fixed lag smoothed distributions of the states and state transitions can be seen to be working well for the BPSK, (QPSK) and 8PSK modulations with up to two transmit antennas. Similar techniques may also be employed in the frequency domain, for example in the context of MIMO decoding by serial-to-parallel converting and then performing a fast Fourier transform prior to MIMO decoding, applying an inverse Fourier transform and parallel-to-serial conversion after MIMO decoding.

Applications of embodiments of the invention include MIMO and non-MIMO receivers, for any type of signal which is susceptible to trellis-based decoding and include applications in base stations, access points, mobile terminals, wireless networks including PANs (personal area networks) and LANs (local area networks) and applications in third and fourth generation mobile phone networks.

Broadly speaking embodiments of the invention facilitate cheaper receivers and/or improved performance, for example increased data rates without correspondingly increased complexity and cost. Embodiments of the invention may also potentially find application in other non-radio communication systems, for example a disk drive with multiple read heads and/or multiple data recording layers (which act like one or more transmitters).

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A trellis decoder for decoding symbols of a received signal, said symbol comprising a sequence defined by transitions between states of a trellis, the trellis decoder comprising:
   means for performing a forward recursion through said trellis to determine a first set of probabilities ($\alpha(X_t)$) each defining a probability of a said trellis state ($X_t$) responsive to one or more current or earlier received signal values ($y_{1:t}$);
   means for providing a second set of ($\beta(X_t)$) probabilities each defining a probability of one or more received signal values ($y_{t+1:T}$) given an earlier said trellis state ($X_t$);
   means to decode said received signal to determine probabilities ($p(b_t|y_{1:T})$) for symbols of a corresponding transmitted sequence of symbols from said first and second sets of probabilities; and wherein said decoder further comprises:
   means to select states for determining said first set of probabilities responsive to one or more received signal values later than a said trellis state defining a probability in said first set.

2. A trellis decoder as claimed in claim 1 wherein said means for providing said second set of probabilities is operable to perform a backwards recursion through said trellis to determine said probabilities ($\beta(X_t)$).

3. A trellis decoder as claimed in claim 1 wherein said means to select states employs a Gaussian approximation to determine a likelihood of a said trellis state from said one or more later received signal values for selecting said states.

4. A trellis decoder as claimed in claim 1, wherein said selecting means is further configured to select states by selecting transitions from previous said trellis states.

5. A trellis decoder as claimed in claim 1 wherein said selecting means is configured to select a state responsive to a probability of said state given said one or more later received signal values.

6. A trellis decoder as claimed in claim 1 wherein said one or more later received signal values comprises signal values received over a fixed time lag interval.

7. A trellis decoder as claimed in claim 1 wherein a said received signal value comprises a vector of signals received over a MIMO channel.

8. A trellis decoder as claimed in claim 1 wherein said decoding comprises joint equalisation and decoding of a space-time and/or channel coded transmitted signal.

9. A trellis decoder as claimed in claim 1 wherein said means to select states comprises means for evaluating one or more log probability metrics dependent upon said one or more later received signal values.

10. A trellis decoder as claimed in claim 1 further comprising means for iterating said forwards and backwards recursion and symbol probability determining; and wherein said means to select states comprises means for determining a probability of a said trellis state responsive to an a priori symbol probability distribution.

11. A trellis decoder as claimed in claim 1 wherein said means to select states is configured to select states at a time (t) responsive to a probability distribution ($p(X_t|y_{1:t+L'})$) of said states given received signal values from an initial time to a future time (t+L').

12. A trellis decoder as claimed in claim 1 wherein said means to select states is configured to select states responsive to an approximation of a probability distribution ($p(y_{t:t+L'}|X_{t-1})$) of received signal values from said time (t) to future time (t+L') given a previous state ($X_{t-1}$), said approximation comprising a multivariate normal distribution having a covariance matrix $\Sigma_t$, and wherein said decoder further comprises means for extrapolating a value of an inverse of said covariance matrix from a value at one said trellis state to a value at a later said trellis state.

13. A trellis decoder as claimed in claim 1 wherein said means to select states is configured to select states at a time (t) responsive to a probability distribution, wherein said probability distribution is approximated by a multivariate normal distribution, said normal distribution being defined by a matrix ($\Sigma_t; \Sigma_{t+j}$), and wherein said means for selecting states further comprises means for extrapolating a value of an inverse of said matrix from a value at one said trellis state to a value at a later said trellis state.

14. A receiver including the decoder of claim 1.

15. A trellis decoder as claimed in claim 1 wherein said means to select states is configured to select states at a time (t) responsive to a probability distribution ($p(b_t|X_{t-1})y_{t:t+L'})$) of transitions from a previous selected state ($X_{t-1}$) given received signal values from said time (t) to future time (t+L').

16. A trellis decoder as claimed in claim 15 wherein said probability distribution ($p(b_t|X_{t-1})y_{t:t+L'})$) is approximated by a product of probability distributions $p(b_t^j|X_{t-1},y_{t:t+L'})$, where j indexes the jth component of a sequence of symbols transmitted together, and where said product is formed for index j running through said transmitted symbols.

17. A trellis decoder as claimed in claim 16 wherein said probability distribution $p(b_t^j|X_{t-1},y_{t:t+L'})$ is approximated by a multivariate normal distribution with a covariance matrix $\Sigma_{t,j}$ the decoder further comprising means for extrapolating a value of an inverse of said covariance matrix from an inverse of a covariance matrix $\Sigma_t$ describing an approximation of a probability distribution ($p(y_{t:t+L'}|X_{t-1})$) of received signal values from said time (t) to future time (t+L') given a previous state ($X_{t-1}$).

18. A method of decoding symbols of a received signal, said symbols comprising a sequence defined by transitions between states of a trellis, each said trellis state being associated with a time, the method comprising:
performing a forward recursion through said trellis to determine a first set of probabilities each defining a probability of a said trellis state responsive to prior values of said received signal;
obtaining a second set of probabilities each defining a probability of one or more received signal values given a prior said trellis state; and
decoding said received signal to determine probabilities for symbols of a corresponding transmitted sequence of symbols from said first and second sets of probabilities;
the method further comprising:
selecting states for determining said first set of probabilities responsive to one or more received signal values later than a said trellis state defining a probability in said first set.

19. A method as claimed in claim 18 wherein said obtaining of said second set of probabilities comprises performing a backwards recursion through said trellis to determine said second set of probabilities.

20. A method as claimed in claim 18 wherein said received signal comprises a vector defining a MIMO signal.

21. A method as claimed in claim 18 wherein said selecting comprises evaluating one or more log probability metrics ($\Phi$, $\theta$).

22. A method of decoding a trellis coded signal using a BCJR-type procedure in which probabilities of transmitted symbols are determined by forwards and backwards iteration through a trellis having successive sets of states associated with successive received signal time intervals, a set of states defining a trellis stage, the method comprising reducing the number of states processed at a said trellis stage ($X_t$) by selecting states for evaluation for determining said probabilities based upon future received signal values ($y_{t:t+L'}$) at said stage.

23. A method as claimed in claim 22 wherein said selecting comprises selecting transitions to said trellis stage from a previous trellis stage.

24. A method as claimed in claim 22 wherein said selecting includes selecting said states responsive to a probability of a said state given said future received signal values.

25. A method as claimed in claim 22, wherein said future received signal values comprise received signal values over a lag time interval (L').

26. A method as claimed in claim 25 wherein said lag time interval is determined by a memory time interval of a channel between a transmitter of said transmitted symbols and a receiver of said received signal.

27. A computer readable storage medium encoded with computer executable instructions, which when executed by a computer, cause the computer to perform a method of decoding symbols of a received signal, said symbols comprising a sequence defined by transitions between states of a trellis, each said trellis state being associated with a time, said method comprising:
performing a forward recursion through said trellis to determine a first set of probabilities each defining a probability of a said trellis state responsive to prior values of said received signal;
obtaining a second set of probabilities each defining a probability of one or more received signal values given a prior said trellis state; and
decoding said received signal to determine probabilities for symbols of a corresponding transmitted sequence of symbols from said first and second sets of probabilities;
the method further comprising:
selecting states for determining said first set of probabilities responsive to one or more received signal values later than a said trellis state defining a probability in said first set.

28. A decoder for decoding symbols of a received signal, said symbols comprising a sequence defined by transitions between states of a trellis, each said trellis state being associated with a time, the decoder comprising:
  a forward recursion unit configured to perform a forward recursion through said trellis to determine a first set of probabilities each defining a probability of a said trellis state responsive to prior values of said received signal;
  an obtaining unit configured to obtain a second set of probabilities each defining a probability of one or more received signal values given a prior said trellis state;
  a decoding unit configured to decode said received signal to determine probabilities for symbols of a corresponding transmitted sequence of symbols from said first and second sets of probabilities; and
  a selecting unit configured to select states for determining said first set of probabilities responsive to one or more received signal values later than a said trellis state defining a probability in said first set.

29. A decoder for decoding a trellis coded signal using a BCJR type procedure in which probabilities of transmitted symbols are determined by forwards and backwards iteration through a trellis having successive sets of states associated with successive received signal time intervals, a set of states defining a trellis stage, the decoder including a system to reduce the number of states processed at a said trellis stage ($X_t$) by selecting states for evaluation for determining said probabilities based upon future received signal values ($y_{t:t+L'}$) at said stage.

30. A receiver including the decoder of claim 28.

31. A trellis decoder for decoding a trellis coded signal using a BCJR type procedure in which probabilities of transmitted symbols are determined by forwards and backwards iteration through a trellis having successive sets of states associated with successive received signal time intervals, a set of states defining a trellis stage, the decoder comprising: a received signal input for said trellis coded signal; an output for providing decoded signal data; program memory for storing processor control code; and a processor coupled to said received signal input, to said output and to said program memory for loading and implementing said code, said code comprising code to: reduce the number of states processed at a said trellis stage ($X_t$) by selecting states for evaluation for determining said probabilities based upon future received signal values ($y_{t:t+L'}$) at said stage.

32. A trellis decoder for decoding symbols of a received signal, said symbols comprising a sequence defined by transitions between states of a trellis each said trellis state being associated with a time, the decoder including a state selector to select trellis states ($X_t$) at a time (t) based on a probability distribution of said states given received signal values from an initial time prior to said time (t) to a future time (t+L').

33. A trellis decoder as claimed in claim 32 wherein said state selector is further configured to select said states by selecting transitions from a previous state ($X_{t-1}$) based on a probability distribution of said transitions given said received signal values from said time (t) to said future time (t+L').

34. A trellis decoder for decoding symbols of a received signal, said symbols comprising a sequence defined by transitions between states of a trellis each said trellis state being associated with a time, the decoder comprising:
  a received signal input for said trellis coded signal;
  an output for providing decoded signal data;
  program memory for storing processor control code; and
  a processor coupled to said received signal input, to said output and to said program memory for loading and implementing said code, said code comprising code to:
  perform a forward recursion through said trellis to determine a first set of probabilities each defining a probability of a said trellis state responsive to prior values of said received signal;
  obtain a second set of probabilities each defining a probability of one or more received signal values given a prior said trellis state; and
  decode said received signal to determine probabilities for symbols of a corresponding transmitted sequence of symbols from said first and second sets of probabilities;
  the code further comprising code to:
  select states for determining said first set of probabilities responsive to one or more received signal values later than a said trellis state defining a probability in said first set.

35. A trellis decoder as claimed in claim 34 wherein said code to obtain said second set of probabilities comprises code to perform a backwards recursion through said trellis to determine said second set of probabilities.

36. A method implemented on a decoder for determining a set of probabilities for states of a trellis corresponding to signal values received over a series of tune instants, the method comprising:
  performing a forward recursion through the trellis over the series of time instants, the forward recursion comprising, for each time instant:
    calculating a metric from at least a signal value received at a time later than the time instant for each possible trellis state at the time instant;
    selecting a set of active states for the time instant from the possible trellis states at the time instant using the metric; and
    calculating a set of probabilities only for each active state at the time instant.

37. A method implemented on a decoder for decoding symbols of a received signal, the symbols comprising a sequence defined by transitions between states of a trellis, each of the states of the trellis being associated with a time instant, the method comprising:
  performing a forward recursion through the time instants of the trellis by:
    calculating a metric from at least a signal value received at a time later than the time instant of the trellis state under consideration for trellis states at the time instant under consideration;
    selecting a set of active states for the time instant under consideration from the possible trellis states at the time instant under consideration using the metric; and
    calculating a set of probabilities of transitions to states at a time instant following the time instant under consideration only for each active state at the time instant under consideration.

* * * * *